(12) United States Patent
Bellessort et al.

(10) Patent No.: US 8,627,200 B2
(45) Date of Patent: Jan. 7, 2014

(54) METHOD AND DEVICE FOR ENCODING A STRUCTURED DOCUMENT AND DEVICE FOR DECODING A DOCUMENT THUS ENCODED

(75) Inventors: Romain Bellessort, Rennes (FR); Youenn Fablet, La Dominelais (FR)

(73) Assignee: Canon Kabushiki Kaisha, Tokyo (JP)

( * ) Notice: Subject to any disclaimer, the term of this patent is extended or adjusted under 35 U.S.C. 154(b) by 395 days.

(21) Appl. No.: 12/668,788

(22) PCT Filed: Jul. 22, 2008

(86) PCT No.: PCT/IB2008/002884
§ 371 (c)(1),
(2), (4) Date: Jan. 12, 2010

(87) PCT Pub. No.: WO2009/136225
PCT Pub. Date: Nov. 12, 2009

(65) Prior Publication Data
US 2010/0192056 A1 Jul. 29, 2010

(30) Foreign Application Priority Data
Jul. 23, 2007 (FR) .................................... 07 56689

(51) Int. Cl.
*G06F 17/00* (2006.01)
(52) U.S. Cl.
USPC ........................... 715/237; 715/234; 715/239
(58) Field of Classification Search
USPC ................................. 715/200, 234, 237, 239
See application file for complete search history.

(56) References Cited

U.S. PATENT DOCUMENTS

| | | | | |
|---|---|---|---|---|
| 6,820,075 | B2 * | 11/2004 | Shanahan et al. | 715/205 |
| 6,928,425 | B2 * | 8/2005 | Grefenstette et al. | 715/209 |
| 2003/0061200 | A1 * | 3/2003 | Hubert et al. | 707/3 |
| 2003/0069877 | A1 * | 4/2003 | Grefenstette et al. | 707/2 |
| 2005/0022114 | A1 * | 1/2005 | Shanahan et al. | 715/513 |
| 2006/0167907 | A1 * | 7/2006 | Jones | 707/100 |
| 2007/0102764 | A1 * | 5/2007 | Ando et al. | 257/355 |

(Continued)

FOREIGN PATENT DOCUMENTS

EP    1 122 655 A2    8/2001

OTHER PUBLICATIONS

Ng, W., et al., "XCQ: A Queriable XML Compression System", http://www.cse.ust.hk/~wilfred/paper/kais05.pdf (2005) (last visited Feb. 27, 2008), pp. 1-29.

(Continued)

*Primary Examiner* — Stephen Hong
*Assistant Examiner* — Gregory J Vaughn
(74) *Attorney, Agent, or Firm* — Fitzpatrick, Cella, Harper & Scinto

(57) ABSTRACT

The method of encoding hierarchized data organized in a plurality of events comprises:
- a step of obtaining an information set of at least one event to be encoded, and
- a step of recovering a grammar according to the information set, said grammar making it possible to describe at least said information set,
- a step of determining whether at least a part, defined by a predetermined criterion, of said information set of at least one event to be encoded can be predicted unequivocally from said grammar,
- if the result of the determination step is positive, a step of encoding so-called "conformity" information representing this positive result, and
- a step of encoding the information of each said event to be encoded not included in said information set.

23 Claims, 16 Drawing Sheets

(56) References Cited

U.S. PATENT DOCUMENTS

Figure 8:
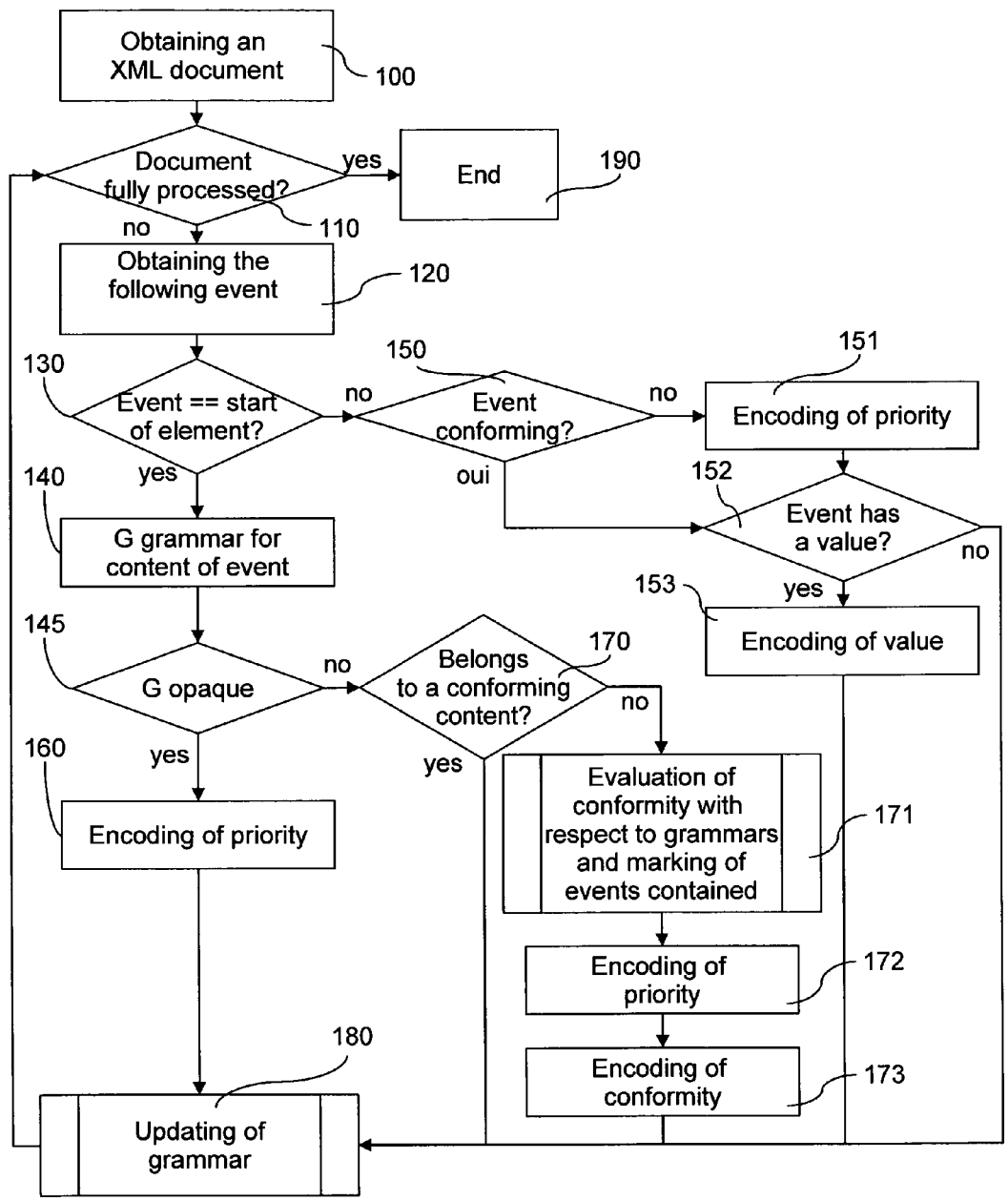

| | | | |
|---|---|---|---|
| 2007/0204283 A1* | 8/2007 | Ando et al. | 720/718 |
| 2007/0257247 A1* | 11/2007 | Ando et al. | 257/3 |
| 2008/0250055 A1 | 10/2008 | Ruellan et al. | 707/102 |
| 2008/0313282 A1* | 12/2008 | Warila et al. | 709/206 |
| 2009/0138529 A1 | 5/2009 | Bellessort | 707/203 |
| 2009/0183067 A1 | 7/2009 | Fablet | 715/234 |
| 2009/0287625 A1 | 11/2009 | Fablet et al. | 706/45 |
| 2010/0001886 A1 | 1/2010 | Bellessort et al. | 341/51 |
| 2010/0010995 A1 | 1/2010 | Fablet et al. | 707/6 |

OTHER PUBLICATIONS

Yeung, L.W., et al., "XCQ: XML Compression and Querying System", Proceedings of the 12$^{th}$ Int'l World Wide Web Conference, Budapest, Hungary (May 2003), pp. 1-2.

Schneider, J., et al., "Efficient XML Interchange (EXI) Format 1.0", http://w3.org/TR/2007/WD-exi-20070716/ (Jul. 2007)(last visited Nov. 15, 2007), pp. 1-46.

* cited by examiner

| person grammar | |
|---|---|
| StartElement lastName | 1 |
| StartElement firstName | 2 |
| EndElement | 3 |
| StartElement * | 4.0 |
| Characters | 4.1 |

| firstName grammar | |
|---|---|
| Characters | 0 |
| EndElement | 1 |
| StartElement * | 2.0 |
| Characters | 2.1 |

| lastName grammar | |
|---|---|
| Characters | 0 |
| EndElement | 1 |
| StartElement * | 2.0 |
| Characters | 2.1 |

Figure 1

```
<person>
    <firstName>John</firstName>
    <lastName>Smith</lastName>
</person>
```

| *person* grammar | |
|---|---|
| StartElement lastName | 1 |
| StartElement firstName | 2 |
| EndElement | 3 |
| StartElement * | 4.0 |
| Characters | 4.1 |

```
<person>
    <firstName>Mary</firstName>
<midName>Springfield</midName>
    <lastName>Wesson</lastName>
</person>
```

| *person* grammar | |
|---|---|
| StartElement lastName | 0 |
| StartElement midName | 1 |
| StartElement firstName | 2 |
| EndElement | 3 |
| StartElement * | 4.0 |
| Characters | 4.1 |

Figure 2

Grammar of children of "person":

| *midName* grammar | |
|---|---|
| Characters | 0 |
| EndElement | 1 |
| StartElement * | 2.0 |
| Characters | 2.1 |

| *firstName* grammar | |
|---|---|
| Characters | 0 |
| EndElement | 1 |
| StartElement * | 2.0 |
| Characters | 2.1 |

| *lastName* grammar | |
|---|---|
| Characters | 0 |
| EndElement | 1 |
| StartElement * | 2.0 |
| Characters | 2.1 |

Structure of the element "person" determined by the grammars:

```
<person>
    <firstName>   CH </firstName>
    <midName>     CH </midName>
    <lastName>    CH </lastName>
</person>
```

Figure 3

```
<dictionnary>
  <value>
     <name>val1</name>
     <struct>
         <val1_struct>...</val1_struct>
     </struct>
  </value>
  <value>
     <name>val2</name>
     <struct>
         <val2_struct>...</val2_struct>
     </struct>
  </value>
  <value>
     <name>val3</name>
     <struct>
         <unknown/>
     </struct>
  </value>
</dictionnary>
```

Figure 4

```
<addressbook>
  <person>
     <firstname>John</firstname>
     <lastname>Smith</lastname>
  </person>
  <person>
     <firstname>Mary</firstname>
     <lastname>Wesson</lastname>
  </person>
</addressbook>
```

Figure 5

| Hexadecimal representation |
|---|
| 00 20 0c 61 64 64 72 65 73 73 62 6f 6f 6b 88 07 70 65 72 73 6f 6e 88 0a 66 69 72 73 74 6e 61 6d 65 c0 06 4a 6f 68 6e 44 09 6c 61 73 74 6e 61 6d 65 c0 07 53 6d 69 74 68 31 00 20 06 4d 61 72 79 00 08 57 65 73 73 6f 6e *28* |
| Textual representation |
| . .addressbook^.person^.firstnameÀ.JohnD.lastname À.Smith1. .Mary..Wesson( |

Figure 6

| Hexadecimal representation |
|---|
| 00 20 0c 61 64 64 72 65 73 73 62 6f 6f 6b 88 07 70 65 72 73 6f 6e 88 0a 66 69 72 73 74 6e 61 6d 65 c0 06 4a 6f 68 6e 44 09 6c 61 73 74 6e 61 6d 65 c0 07 53 6d 69 74 68 31 00 *30* 06 4d 61 72 79 08 57 65 73 73 6f 6e *40* |
| Textual representation |
| . .addressbookD.personD.firstnam e`.JohnD.lastname`.Smith1.0.Mary.Wesson@ |

Figure 7

METHOD AND DEVICE FOR ENCODING A STRUCTURED DOCUMENT AND DEVICE FOR DECODING A DOCUMENT THUS ENCODED

The present invention concerns a method and device for encoding a structured document and a method and device for decoding a document thus encoded.

XML (the acronym for "Extensible Markup Language", that is to say extensible markup language) is a syntax for defining computer languages. XML makes it possible to create languages adapted to different uses but able to be processed by the same tools.

An XML document is composed of elements, each element commencing with an opening tag comprising the name of the element (for example: "<tag>") and ending with a closing tag also comprising the name of the element (for example: "</tag>"), each element being able to contain other elements or text data. An element can be specified by attributes, each attribute being defined by a name and having a value. The attributes are placed in the opening tag of the element that they specify (for example "<tag attribute='value'>").

XML syntax also makes it possible to define comments (for example: "<!—Comment—>") and processing instructions that can specify to a computer application which processing operations to apply to the XML document (for example: "<?myprocessing?>").

It is considered hereinafter that XML data is described in terms of events, each event being able to be a start of an element (<tag>), an end of element (</tag>), an attribute, a text content, a comment or a processing instruction.

Several different XML languages can contain elements with the same name. In order to be able to mix several different XML languages, an addition has been made to the XML syntax making it possible to define namespaces ("Namespaces" in English). Two elements will be identical only if they have the same name and are situated in the same namespace. A namespace is defined by a URI (the acronym for "Uniform Resource Identifier", meaning uniform resource identifier) (for example: "http://canon.crf.xml/monlangage"). The use of a namespace in an XML document requires defining a prefix that is a shortcut to the URI of this namespace. This prefix is defined by means of a specific attribute (for example: "xmlns:ml='http://canon.crf.fr/xml/monlangage'" associates the prefix "ml" with the URI "http://canon.crf.fr/xml/monlangage"). Next, the namespace of an element or attribute is specified by causing its name to be preceded by the prefix associated with the namespace followed by ":" (for example: "<ml:tag ml:attribute='value'>").

XML has many advantages and has become a standard for storing data in a file or for exchanging data. XML makes it possible in particular to have available many tools for processing the files generated. Moreover, an XML document can be edited manually with a simple text editor. In addition, as an XML document contains its structure integrated in the data, this document is highly readable even without knowing its specification.

The main drawback of XML syntax is being very prolix. Thus the size of an XML document can be several times greater than the intrinsic size of the data. This great size of XML documents also gives rise to lengthy processing time when XML documents are generated and in particular read.

To remedy these drawbacks, other methods for encoding an XML document have been sought. The aim of these methods is to code the content of the XML document in a more compact form, but making it possible to easily reconstruct the XML document. However, the majority of these methods do not keep all the advantages of the XML format.

Among these methods, the most simple consist of coding the structure data in a binary format instead of using a text format. In addition, the redundancy of the structural information in the XML format can be eliminated or at least reduced (for example, it is not necessarily useful to specify the name of the element in the opening tag and closing tag).

Another method is to use an index table, in particular for the names of elements and attributes that are generally repeated in an XML document. Thus, when an element name first occurs, this is coded normally in the file and an index is associated with it. Then, for the following occurrences of this element name, the index will be used in place of the complete string, reducing the size of the document generated but also facilitating reading (there is no longer any need to read the complete string in the file and, in addition, the element read can be determined by a comparison of integers instead of a comparison of character strings).

Finally, apart from these elementary methods, there exist more sophisticated methods consisting in particular of taking into account more structural information in order to compress the data further. The case of Efficient XML can be cited, a format used as a basis for the standardization of a binary XML format by the EXI group of W3C (the acronym for Worldwide Web Consortium), which takes into account the order of appearance of the various events within a document in order to construct grammars that will make it possible to encode the most frequent events in a small number of bits.

In this context, a grammar is composed of a set of productions, each production comprising an XML event description, an associated coding value and the indication of the following grammar to be used. To code an XML event using a grammar, the production containing the most precise description of the XML event is used. The coding value contained in this production is used to represent the event, and the information contained in the event and not described in the production is coded.

A grammar is open to change. In a certain number of cases, after the occurrence of an XML event already described by a production of the grammar (if it is not described by a production, it cannot be encoded by the grammar), the grammar is modified in order to include a new production corresponding to this XML event. This production can either contain a more precise description of the event, reducing the number of items of information to be coded to represent the event, or have a more compact coding value.

The coding values are expressed in the form of priorities having 1 to 3 levels. Coding a coding value amounts to coding the values of its priority. Each level is coded in a minimum number of bit or bits in order to be able to code the largest value of this level associated with a production of the grammar.

In order to code an XML document, a set of grammars is used. A few grammars serve to code the structure peculiar to the XML document. In addition, for each type of XML element present in the document (an XML element type being a set of elements having the same name), a set of grammars is used to code the XML elements of this type.

The rules of grammars used can be generic rules, common to all the XML documents and constructed from the XML syntax, or rules specific to a type of document, constructed from an XML schema describing the structure of this type of document.

At decoding, the reverse process is used: the coding value is extracted and makes it possible to identify the coded XML event, as well as the supplementary information to be decoded.

In addition, on decoding, the same grammar change rules are used, making it possible to have at any time a set of grammar rules identical to that which was used during coding.

The following XML fragment is used to describe the coding of an XML document by means of the Efficient XML specification.

```
<person>
    <firstName>John</firstName>
    <lastName>Smith</lastName>
</person>
```

Since the encoder has not encountered a "person" element previously, a "default" grammar is created for this element. This is a grammar containing only generic productions. During the encoding of the "person" element, new productions will be inserted to make grammar linked to the "person" element more effective. The "default" grammar used to code the content of the "person" element is as follows (in a simplified fashion compared with the Efficient XML specification).

:ElementContent:

| | |
|---|---|
| EE | 0 |
| SE (*) ElementContent | 1.0 |
| CH ElementContent | 1.1 |

"EE" corresponds to the end of element event, "SE (*)" corresponds to any start of element event (the name is not specified) and "CH" corresponds to a text content event.

During encoding, after having received the event corresponding to the start of "person" element ("SE (person)") and having coded it, the encoder selects the coding grammar of the content of the "person" element described above.

Next the encoder receives the event corresponding to the start of the "firstName" element ("SE (firstName)"). The production that corresponds to this event in the above grammar is the second:

| | |
|---|---|
| SE (*) ElementContent | 1.0 |

The encoder therefore codes the priority "1.0". As the first priority level comprises two distinct values (0 and 1), this level can be coded in one bit, with the value "1". Likewise, the second priority level comprises two distinct values and can be coded in one bit, with the value "0". The priority "1.0" is therefore coded here with the two bits "10".

Next, as the production does not specify the name of the element, "firstName" is coded.

The encoding of the content of "firstName" grammar is then continued. To do this, the rule associated with this element is sought. As no "firstName" element has been encountered, a "firstName" is created from the default grammar. The "firstName" element contains a text node for a single child. Once this text node is encoded, the grammar of "firstName" is updated by inserting a text production (CH):

ElementContent:

| | |
|---|---|
| Characters | 0 |
| EE | 1 |
| SE (*) ElementContent | 2.0 |
| CH ElementContent | 2.1 |

Once the content of "Firstname" is coded, the encoder modifies the grammar associated with the "person" element in order to adapt the grammar to the XML data encountered. For this purpose, a new production is added to the grammar, this production corresponding to the start of the "firstName" element. The priority "0" is associated with this production and the other priorities are shifted in order to keep the unity of the priorities. The grammar becomes:

ElementContent:

| | |
|---|---|
| SE (firstName) ElementContent | 0 |
| EE | 1 |
| SE (*) ElementContent | 2.0 |
| CH ElementContent | 2.1 |

The following event is the start of the "lastName" element. As with "firstName", this element is coded using the production:

| | |
|---|---|
| SE (*) ElementContent | 2.0 |

The first priority level having now three possible values, it is coded in two bits, with the value "2". The second priority level is always coded in a single bit. The priority "2.0" is therefore coded here with the three bits "100".

The name of the "lastName" element is then coded. Then the content of "lastName" is coded by means of the grammar associated with the element "lastName".

After this the grammar is modified to add thereto a production corresponding to the start of the "lastName" element and then becomes:

ElementContent:

| | |
|---|---|
| SE (lastName) ElementContent | 0 |
| SE (firstName) ElementContent | 1 |
| EE | 2 |
| SE (*) ElementContent | 3.0 |
| CH ElementContent | 3.1 |

If subsequently, in the document, the coder encounters another similar "person" element, this element will be coded using this grammar.

Thus the first event corresponding to the content of the "person" element is the event of the start of the "firstName" element. This element is coded with the production:

| | |
|---|---|
| SE (firstName) ElementContent | 1 |

The production

| | |
|---|---|
| SE (*) ElementContent | 3.0 | also corresponds to this event but is less precise (it does not specify the name of the element). It is therefore the first production that is used.

The encoder therefore codes the priority of this production, namely "1", which is coded with the two bits "0.1". There is no need to code the name of the elements since this is specified by the production.

The encoder next codes the content of the "firstName" element.

As a production specific to the event of the start of the "firstName" element already exists in the grammar, it is not necessary to add a new production to the grammar.

The encoder next codes, in a similar manner, the "lastName" element start event, coding only the priority "0" with the two bits: "00".

Thus, for the coding of the second "person" element similar to the first, the code generated is more compact, since it is no longer necessary to code the name of the elements contained in "person", neither literally (by coding the whole of the character string), nor even using an index.

If a schema is available to describe the content of a "person", namely a "firstName" element and a "lastName" element, it is possible to construct from the very start the grammar generated after the end of the coding of the first "person" element.

However, if the schema also specifies that the "firstName" and "lastName" elements must be ordered within the "person" element, "firstName" preceding "lastName", it is possible to generate the following grammars to describe the content of "person".

ElementContent1:

| | |
|---|---|
| SE (firstName) Element Content2 | 0 |
| EE | 1 |
| SE (*) ElementContent1 | 2.0 |
| CH ElementContent1 | 2.1 |

ElementContent2:

| | |
|---|---|
| SE (lastName) ElementContent3 | 0 |
| EE | 1 |
| SE (*) ElementContent2 | 2.0 |
| CH ElementContent2 | 2.1 |

ElementContent3:

| | |
|---|---|
| EE | 0 |
| SE (*) ElementContent2 | 1.0 |
| CH ElementContent2 | 1.1 |

These grammars use the known order of appearance of the "firstName" and "lastName" elements to separate the productions into several grammars and reduce the number of productions per grammar and consequently the number of bits necessary for coding a priority.

These grammars can even be reduced if the deviations with respect to the schema are not accepted and then become:

ElementContent1:

| | |
|---|---|
| SE (firstName) Element Content2 | 0 |

ElementContent2:

| | |
|---|---|
| SE (lastName) ElementContent3 | 0 |

ElementContent3:

| | |
|---|---|
| EE | 0 |

In this case, each grammar containing only one priority, this priority does not need to be coded. Thus all the events describing the content of the "person" element as described above are coded in zero bits.

The present invention is situated particularly in the context where no XML schema is used by the encoder. Because of this, at the start of the encoding of the document, the generic rules apply for each new element encountered. Taking the previous example again, at the end of the encoding of the first "person" element, the rules illustrated in FIG. 1 are obtained.

The "lastName" element is inserted last in the rules since it is the last of the child elements of the "person" element. The order of insertion of the productions follows in this example the order of appearance of the elements.

The EXI working group of W3C is currently working on the standardization of a binary XML format based on Efficient XML. In this context, various improvements have been proposed, including the use of coalescent grammars or combined events. In both cases, it is a case of grouping, in a single production, several events where it is known that they occur successively. These proposals have been made in the context of the use of XML schemas, an XML schema being a description of the content of an XML document, that is to say a definition of the XML elements used and their content (attributes, child elements, text content, etc). This is because, by virtue of an XML schema, it is possible to know that certain events will follow each other, for example a start of element and attributes required for this element, or the end of a child element and the end of the parent element. The idea evoked therefore consists of determining such events and then defining a production grouping them together. This approach therefore requires specific processing in order to identify events that follow each other and then the addition of one or more productions to the grammars: this is therefore a process that is expensive in terms of calculations, and whose impact may be negative. This is because, if based on schemas, it is possible to define rules with a low risk of errors (the case where the production grouping together the elements is not the production to be used). On the other hand, in the case where a schema is not used, the risk of error is higher and it may be therefore that a rarely used production is inserted, this insertion causing an increase in the coding cost of each production.

The present invention aims to remedy these drawbacks.

According to a first aspect, the present invention relates to a method of encoding hierarchized data organized in a plurality of events, comprising:
- a step of obtaining an information set of at least one event to be encoded, and
- a step of recovering a grammar according to the information set, said grammar making it possible to describe at least said information set, characterized in that it also comprises:
- a step of determining whether at least a part, defined by a predetermined criterion, of said information set of at least one event to be encoded can be predicted unequivocally from said grammar,
- if the result of the determination step is positive, a step of encoding so-called "conformity" information representing this positive result, and
- a step of encoding the information of each said event to be encoded not included in said information set.

In fact, the inventors have determined that the structures of XML elements have a tendency to repeat themselves. The implementation of the present invention takes advantage of this potential redundancy in order to better use the grammars and compress more compactly the elements that are already described by a grammar.

In particular, the current encoding of EXI does not take advantage of this insertion order: in the above example, the presence of the "lastName" element as a child of "person" is encoded there in the same number of bits (here two) that there are before or after the "firstName" element. This remark applies also to the encoding of the content of the "lastName" element: an element containing only text on a first occasion in a document has great chances of containing only text in all its following occurrences. Currently an "lastName" element containing only text will use two bits to declare that it has a child text node and two bits to declare that it has an end of element event, four bits in total. It should be noted that, by implementing the present invention, contrary to the approach proposed at the W3C, which seeks to study data for determining events that it is advantageous to group within the same production, use is made of defined grammars to determine the conformity of the data, for example XML, to be encoded.

The implementation of the present invention is all the more effective since all the added (non-generic) productions of a particular element exactly describe the following occurrences of this element.

According to particular characteristics, during the determination step at least one event generated from productions of the said grammar or ordered in a predefined manner is recovered and the information set of at least one event generated is compared with the information set of at least one event to be encoded.

For example, at the first determination step concerning a grammar, events are generated from productions of said grammar and, for the other determination steps concerning this grammar, these generated events are once again used. The duration of encoding is thus improved.

According to particular characteristics, the encoding method as succinctly disclosed above comprises, if the result of the determination step is negative, a step of encoding said information set.

According to particular characteristics, during the obtaining step, said information set of at least one event to be encoded comprises the structure information of at least one event to be encoded.

According to particular characteristics, during the obtaining step, said information set of at least one event to be encoded comprises information indicating whether the value of said event can be encoded by reference to a previously encoded value.

For example, events are indexed and this index is used.

According to particular characteristics, the information set of at least one event to be encoded is divided into a plurality of subsets of information and the result of the determination step is positive if a predetermined selection of information subsets or at least one event to be encoded can be predicted unequivocally from said grammar.

For example, the predictability is determined by subsets which are the attributes, the elements or direct child events or the sets of elements or descendant events.

According to particular characteristics, a subset is selected according to the number of times that said information subset has been able to be predicted unequivocally from said grammar and/or the number of times that said information subset has not been able to be predicted, during the decoding of at least one previous event to be encoded among the plurality of events.

According to particular characteristics, if the result of the determination step is positive and the information set comprises at least one non-selected information subset, the method also comprises a step of encoding each non-selected information subset.

According to particular characteristics, if the result of the determination step is negative and the information set comprises at least one selected information subset, the method comprises a step of encoding so-called "non-conformity" information representing this negative result.

According to particular characteristics, an information subset of said information set comprises the information relating to the events of the text type, or more particularly of the space type.

According to particular characteristics, an information subset of said information set comprises the information relating to the events of the attribute type.

According to particular characteristics, an information subset of said information set comprises the information relating to the events of the start of element type.

By virtue of each of these provisions, even if the information set to be encoded differs slightly from what is predicted by the grammar, its encoding comprises information making it possible to reconstruct the part that can be predicted. The efficacy of the method that is the object of the present invention therefore extends to the events having a slight variation with what is predictable.

According to particular characteristics, during the step of recovering a grammar, said grammar is recovered according to at least one previously encoded event.

According to particular characteristics, the encoding method as succinctly disclosed above also comprises a step of updating the grammar recovered from the information set of at least one event to be encoded.

According to particular characteristics, when a step of encoding all or part of said information set is implemented, the step of updating the recovered grammar takes into account the order of the events to be encoded.

For example, the non-selected subsets are encoded according to coding methods known from the prior art.

According to particular characteristics, the hierarchized data is the data of a structured XML document.

According to particular characteristics, at least one said grammar is an EXI grammar.

According to a second aspect, the present invention concerns a method of decoding hierarchized data organized in a plurality of events, characterized in that it comprises:

a step of obtaining so-called "conformity" information representing the fact that at least part of an information set of at least one event to be decoded can be predicted unequivocally from a grammar, a step of obtaining said grammar, and a step of generating the unequivocally predicted information from said grammar.

According to particular characteristics, the step of obtaining the so-called "conformity" information comprises a step of decoding the conformity information.

According to particular characteristics, during the step of obtaining the so-called "conformity" information, the conformity information is obtained according to past decodings.

According to a third aspect, the present invention relates to a device for encoding hierarchized data organized in a plurality of events, comprising:

a means of obtaining an information set of at least one event to be encoded, and a means of recovering a grammar according to the information set, said grammar making it possible to describe at least said information set, characterized in that it also comprises:

a means of determining whether at least a part, defined by a predetermined criterion, of said information set of at least one event to be encoded can be predicted unequivocally from said grammar, an encoding means adapted, if the result of the determination step is positive, to encode so-called "conformity" information representing this positive result, and adapted to encode the information of each said event to be encoded not included in said information set.

According to a fourth aspect, the present invention relates to a device for decoding hierarchized data organized in a plurality of events, characterized in that it comprises:

a means of obtaining so-called "conformity" information representing the fact that at least part of an information set of at least one event to be decoded can be predicted unequivocally from a grammar, a means of obtaining said grammar, and a means of generating the unequivocally predicted information from said grammar.

According to a fifth aspect, the present invention relates to a computer program that can be loaded into a computer system, said program containing instructions for implementing the encoding method or the decoding method as succinctly disclosed above.

According to a sixth aspect, the present invention relates to an information carrier that can be read by a computer or a microprocessor, removable or not, storing instructions of a computer program, characterized in that it allows the implementation of the encoding method or of the decoding method as succinctly disclosed above.

The advantages, aims and characteristics of this encoding device, this decoding method, this decoding device, this computer program and this information carrier being similar to those of the encoding method that is the object of the present invention, as succinctly disclosed above, they are not repeated here.

Figure 14:
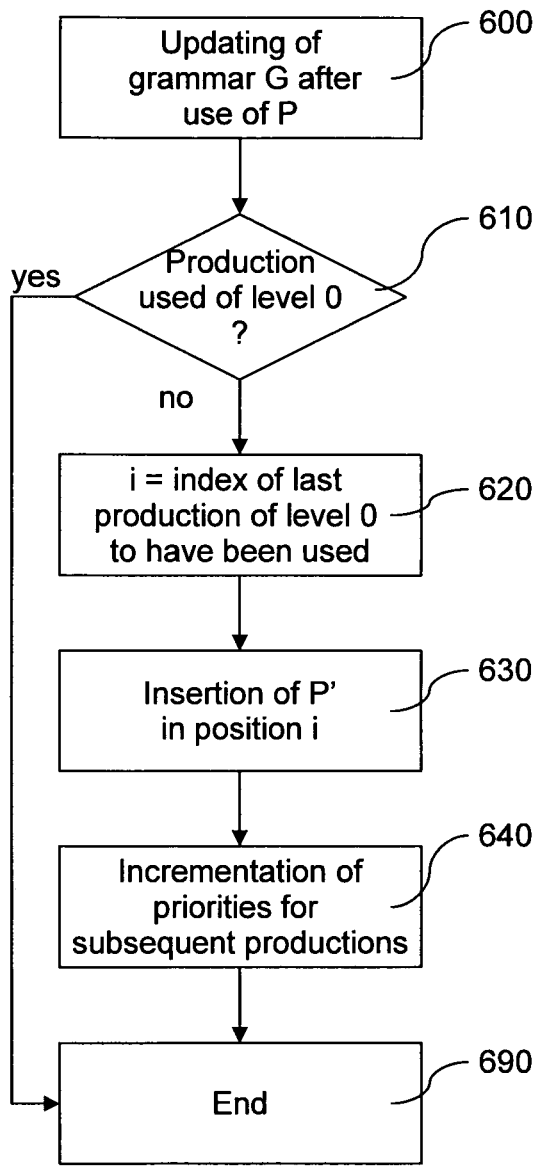
Figure 15:
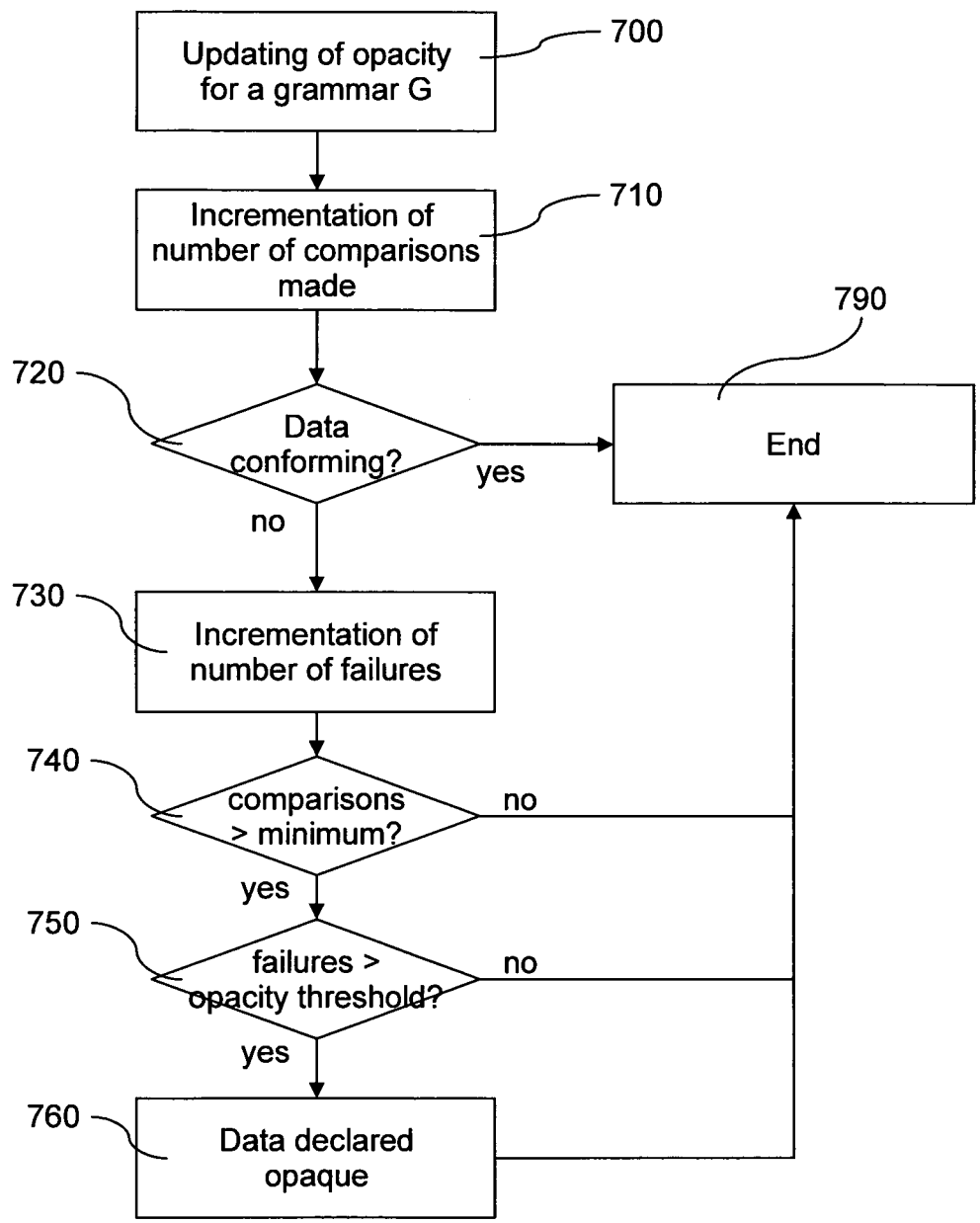
Figure 16:
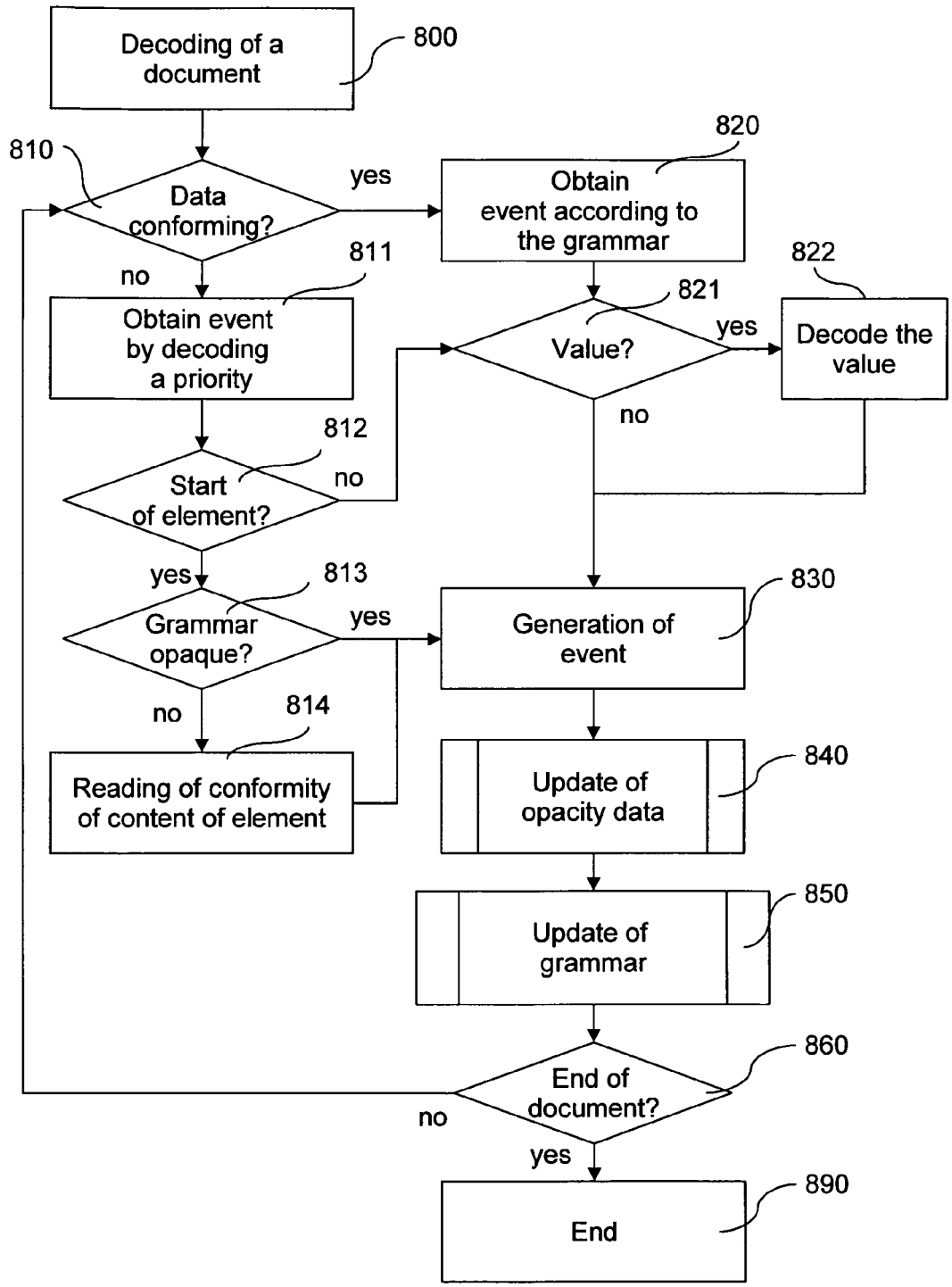
Figure 17:
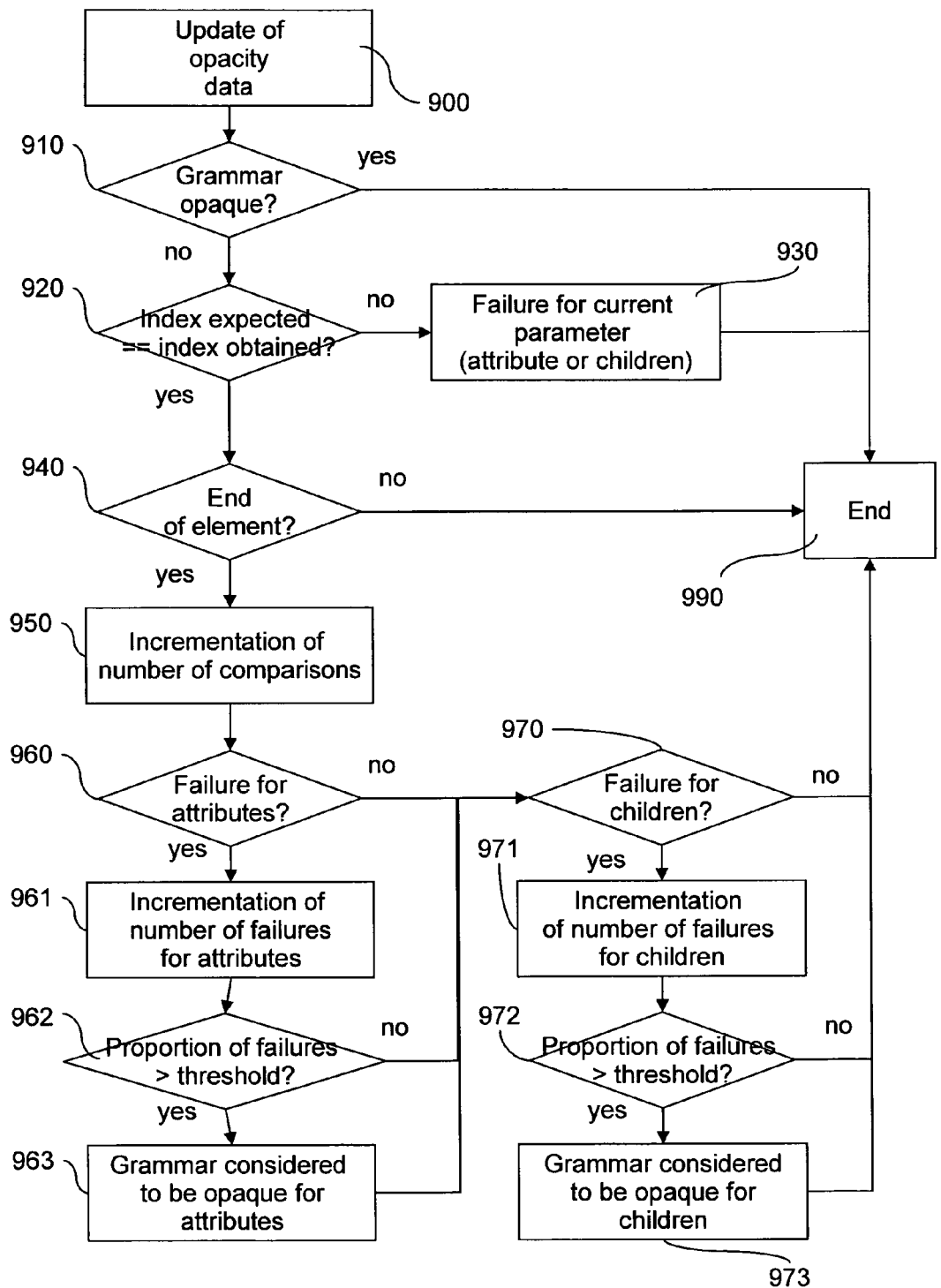
Figure 18:
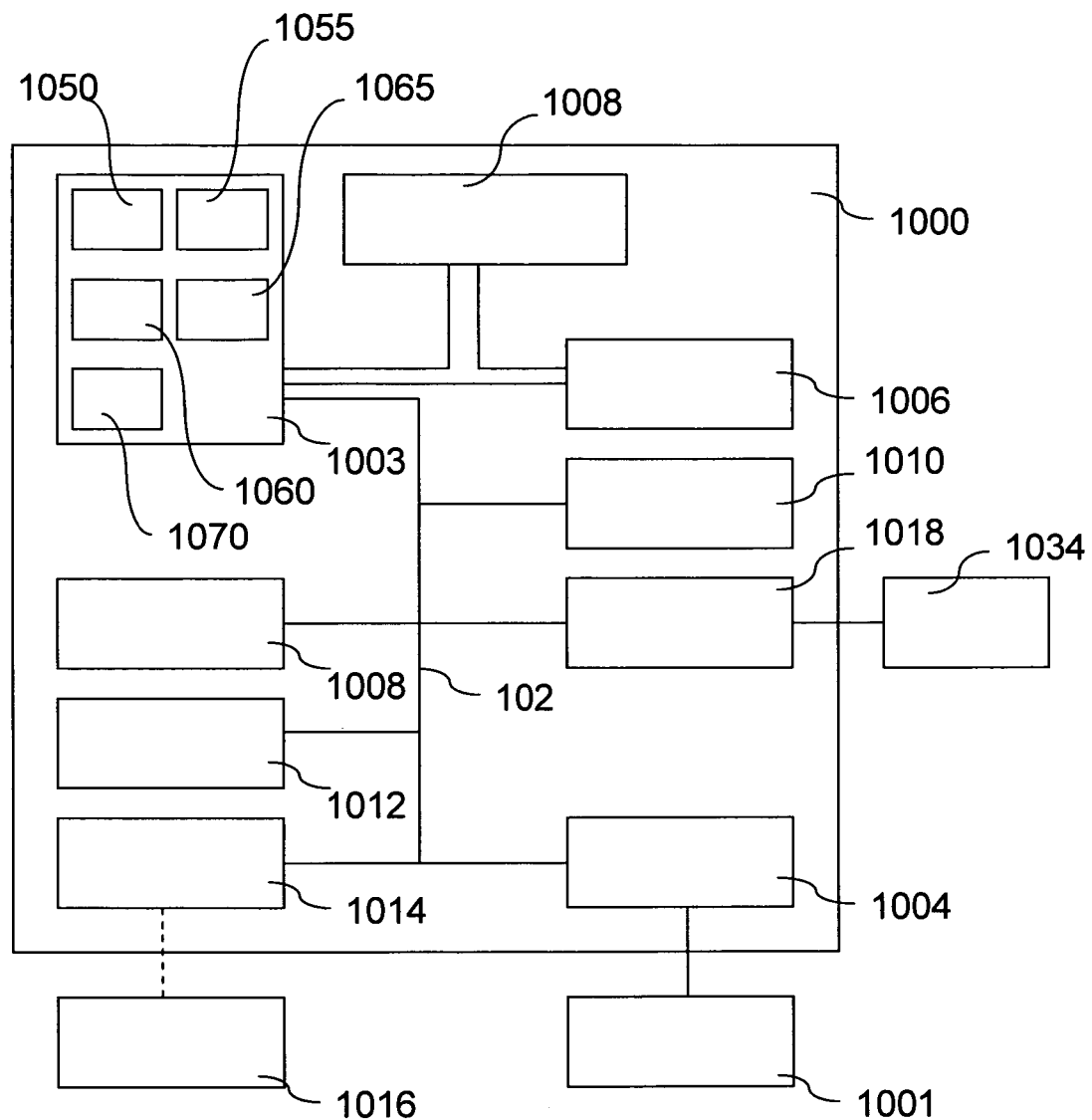

Other advantages, aims and characteristics of the present invention will emerge from the following description given, for explanatory purposes and in no way limiting, with regard to the accompanying drawings, in which:

FIG. 1 depicts an example of known encoding of an XML document element,

FIGS. 2 and 3 depict examples of encoding of an XML document element obtained by implementing a particular embodiment of the encoding method that is the object of the present invention, FIG. 4 depicts a particular XML document, FIG. 5 depicts another XML document, FIGS. 6 and 7 depict a result of encoding of the document illustrated in FIG. 5, according to the Efficient XML format, and implementing a particular embodiment of the encoding method that is the object of the present invention, respectively, FIGS. 8 to 15 depict, in the form of logic diagrams, steps implemented in a particular embodiment of the encoding method that is the object of the present invention, FIGS. 16 and 17 depict, in the form of logic diagrams, steps implemented in a particular embodiment of the decoding method that is the object of the present invention, and FIG. 18 depicts, schematically, a particular embodiment of a device for implementing the encoding and/or decoding methods that are the objects of the present invention.

Although the present invention is described for structured data of an XML document, the present invention is not limited to this type of document but on the contrary extends to the encoding and decoding of all hierarchized data organized in a plurality of events.

FIG. 1 describes conventional EXI encoding. It should be noted that, in FIG. 1, as, later, in FIGS. 2 and 3, the left-hand column corresponds to the encoded data and the right-hand column corresponds to the situation for the "person" element after the encoding of this data.

It will be observed that, by virtue of the implementation of the particular embodiment of the encoding method that is the object of the present invention illustrated in the figures, the order of insertion of the production corresponding to the element "midName" is modified so that the order of the productions corresponds to the order of the elements: the production "midName" is thus situated between the productions "firstName" and "lastName", as illustrated in FIG. 2.

When a new "person" element is encountered, the implementation of the invention consists of comparing the content of the "person" element with its grammar. The most probable structure of the "person" element is determined from all the grammars of the "person" element and its known children ("firstName", "midName" and "lastName"), as illustrated in FIG. 3.

It is then possible to compare the "person" element to be encoded with the structure determined by the grammar. If the structure determined corresponds to the data to be encoded, it is then said that the data to be encoded is "in conformity" with the grammar, and it is then possible to use a specific encoding:

the fact that the structure determined corresponds to the element to be encoded is encoded by means of a bit set to "1", and all the values of the element are encoded in their order of appearance.

If the data to be encoded is not in accordance with the structure determined by the grammar, a different encoding is performed for the "person" element:

the absence of conformity is encoded by a bit set to "0", and the "person" element is encoded as is known in the prior art by including the priorities and values.

It should be noted that, in the latter case, the comparisons are made on the children of the "person" element.

The comparison disclosed above functions very well when the structures are exactly repetitive. However, some documents, like the one given in the example illustrated in FIG. 4, contain elements where the comparison with the grammar will never be good. It is a case for example of elements whose content is a choice between several elements. In the example in FIG. 4, the element "struct" will never be in conformity with what is predicted by the grammar. The comparison of the element "value" with its grammar does not therefore function, because of the variability of the content of the element "struct".

To resolve this problem, in particular embodiments, including the one described with regard to the figures, the concept of opacity of the rules is introduced: the element "struct" not being in conformity with its grammar, the grammar is marked as being opaque at the end of a certain number of encodings of this element. The comparison of the element "value" then no longer takes account of the content of the element "struct" and can once again predict the exact structure of the element "value".

The example of a document in FIG. 4 illustrates the principle of the opacity of the children of an element. Opacity levels applying to the various parts of an element are defined:
 opacity of the children: when the variance of the elements is high,
 opacity of the attributes: when the variance of the attributes is high,
 opacity of the text nodes: when the variance of the presence of the text nodes is great.

The opacity levels of each grammar are determined at the encoder according to the result of the previous encodings. They are calculated at the decoder according to the result of the previous decodings, which makes it possible not to have to encode this opacity data item explicitly in the stream and therefore not to reduce the compression ratio.

The spaces ("whitespaces") are generally situated between two starts of elements, two ends of elements or between a start and end of an element. In Efficient XML, the spaces generate the insertion of a production "Characters" in the grammar that do not distinguish them from other text nodes. Preferentially, in order to be effective, the comparison between grammar and XML data used by the present invention takes these spaces into account.

To this end, it should be noted that the elements with mixed content (elements containing child elements and text nodes that are not spaces) are relatively rare. Because of this, the conjoint presence in a grammar of a production CH and one or more productions SE generally corresponds to the presence of spaces between the starts/ends of elements. In such a case, the comparison between grammar and XML data is modified in order to include a test on the text nodes. The result of this test is positive when all the direct text nodes of the element compared are spaces. It is also possible to add the constraint that all the text nodes are already indexed. If the comparison fails several times, it is then decided to make these text nodes opaque.

In the case where a production specific to the spaces is used ("Whitespace" production, possibly defining a value for the string of spaces), this method would also function. This is because, instead of detecting the "Characters" productions corresponding to spaces, it would suffice to apply the space insertion when a "Whitespace" production is encountered.

Using a simple document, illustrated in FIG. 5, a description is given below of the result of the encoding of this document according to the Efficient XML format, illustrated in FIG. 6, on the one hand and implementing the present invention and using Efficient XML, illustrated in FIG. 7, as a basis on the other hand. For more convenience, the binary XML streams of FIGS. 6 and 7 have been modified in order to be more legible: the encoding of the names and values of elements always commence at the start of a byte.

In FIGS. 6 and 7, the characters in bold correspond to the priorities encoded for defining the structure of the document. The other characters correspond to the names of elements and values of elements encoded in UTF-8. The two streams are exactly identical as far as the second occurrence of the "person" element (the first character in italics in the figures). In both cases, the first step is to close the first "lastName" element and the first "person" element, which gives the series of "0" and then "01" bits, which form the start of the character "0x31". Next the start of "person" element event is encoded, which will form the end of the character "0X31", the character "0x00" and the first three bits "001" of the character "0x20" and "0x30".

The two encodings will then diverge: Efficient XML continues by encoding the priority corresponding to the start of the "firstName" element, which forms the character "0x20". On the other hand, the implementation of the present invention determines first of all whether the new occurrence of the "person" element corresponds to the structure predicted by the grammar. As is the case in our example, a single bit set to "1" is added, which forms the character "0x30".

The encoder that is the object of the present invention next encodes the text values contained in the "person" element ("Mary" and "Wesson") as far as the last character "0x40", which corresponds to the encoding of the priority of the end of "addressbook" element event. The Efficient XML encoder encodes the value "Mary" and then the end of "firstName" element priority, the start of "lastName" element priority, which forms the character "0x00", the value "Wesson" and then the end of "lastName", "person" and "addressbook" element priorities, which forms the character "0x28".

The decoder that is the object of the present invention has a functioning symmetrical with that of the encoder, as illustrated in FIGS. 16 and 17.

In the particular embodiment of the encoding method that is the object of the present invention illustrated in FIG. 8, an XML document is first of all obtained during a step 110. Then, during a step 110, it is determined whether the document has been fully processed. If so, the processing ends during a step 190. Otherwise, during a step 120, a set of information of at least one event to be encoded is obtained. In the embodiment described in FIG. 8, it is a question of data of a single XML event, precisely the XML event following the last event already encoded, and, during a step 130, it is determined whether this event corresponds to a start of element. If not, during a step 150, the conformity of the event, which may be true, false or unknown, is determined. In the last two cases, it is considered that the event is not in conformity and a step 151 is passed to, during which the priority associated with the event is encoded, according to the conventional encoding functioning.

Following step 151 or if, during step 150, it has been determined that the conformity is true, during a step 152, it is determined whether the event has a value. If so, this value is encoded during a step 153. In the case where the prediction of the conformity comprises the state of indexing of the value, that is to say if this value has already been indexed or not, the value is encoded without specifying its indexing state. If at step 152 it is determined that the event has no value, or following step 153, a step 180 of updating the grammars is passed to, detailed in FIG. 14.

If, during a step 130, it is determined that the event corresponds to a start of element, during a step 140, the grammar used for the content of the element that is processed, called "G", is obtained and, during a step 145, it is determined whether this grammar G is opaque. Generic grammars, which do not describe a precise element, and which are used in particular for the first instance of each element, are, by default, opaque. This is because, since they are generic, it is known that they do not correctly describe the XML data encountered. If the result of step 145 is positive, during a step 160, the priority associated with the event is encoded and then step 180 is passed to. This is because, in the case of an opaque grammar, it is not necessary to compare the data with the grammar or to encode conformity information, since the priorities are always used for encoding the events.

If the result of step 145 is negative, that is to say if the grammar is not opaque, during a step 170, it is determined whether the start of element processed belongs to a content already considered in conformity with the said grammar. For an element having a parent, this means that, when the conformity of the children of the parent has been determined, the result has been positive. This information is therefore known since the parent was encoded before encoding the child. However, it may happen that an element does not have a parent (the case of a root element of an XML document), or that the determination has not been able to be made on the parent element (the case where the data is buffered or the size of the buffer is too small to contain the parent element entirely). In this case, the conformity is unknown and the processing is equivalent to that of a known false conformity, that is to say a non-conformity. If the result of step 170 is negative, during a step 171, described in more detail with regard to FIG. 9, the conformity of the content of the element with respect to the grammars describing the element and its content are determined and, in the case of conformity, the conforming events are marked as such. Next, during a step 172, the priority linked to the element start is encoded and then, during a step 173, the conformity of the content of the element is encoded, known by virtue of step 171. The conformity is coded in a bit equal to "0" if the data is not in conformity and "1" if the data is in conformity. The step 180 of updating the grammars is then passed to. If the result of step 170 is positive, that is to say if the event is an element start belonging to a conforming content, step 180 is passed to. This is because, in this case, the conformity of the content is already known and it is not necessary to code a priority.

Following step 180, step 110 is returned to in order to iterate the steps illustrated in FIG. 8 as long as the end of the document has not been reached.

A variant of FIG. 8 consists of using a buffer containing only one event. In this case, the conformity is evaluated for any type of event and not only for the starts of elements (the case in FIG. 8), and the evaluation of the conformity consists of checking whether the event to be coded is described by the following production in the grammar (the current production being that which was used to encode the previous event). If the event is indeed that expected according to the grammar, the conformity information, true or false, is encoded in one bit and the priority associated with the event is not encoded. If this is not the case, the non-conformity information, or discordance, is coded, and then the priority. The advantage of this variant stems from the fact that, while being inexpensive in terms of memory (small size of buffer), it makes it possible to code the conforming events in only one bit. In addition, in the case of starts of elements, it is possible to evaluate also the conformity of the attributes (which are not necessarily seen as distinct events), and therefore to code the start of the element and the attributes in a single bit in the case of conformity (for the attributes, it is also necessary to code the values, in addition).

Figure 9:
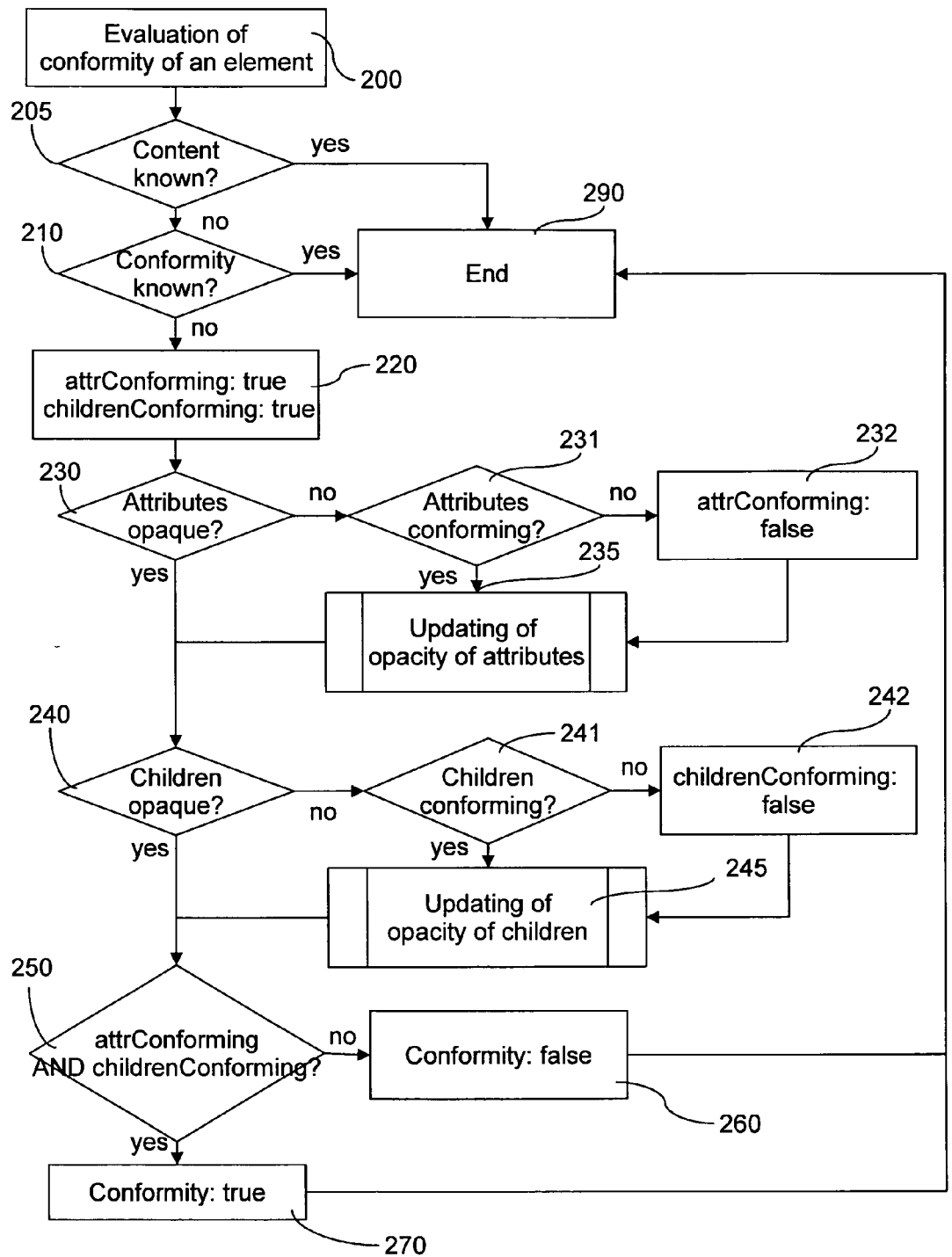

FIG. 9 details steps of determining conformity of an element. During a step 200, an element to be processed is obtained. In order to proceed with the determination of the conformity of the element, the content of this element must be entirely known. In the case where the XML data is buffered, it may happen that the size of the buffer does not make it possible to contain the content of the element necessary for calculating the conformity of the element. It is therefore determined whether the known content is sufficient, during a step 205, and if not the processing ends during a step 290. If on the other hand the content is known, it is determined whether the conformity of the content of the element is already known, during a step 210.

This occurs in the case where the element studied is a child of an element that has already been processed, this parent element not having been identified as conforming. This is because, if the parent element had been identified as conforming, then all the content of this document would have been encoded as conforming content and step 171 of FIG. 8, which initiates the determination of the conformity, would then not have been arrived at, the result of step 170 then being positive. In the case where conformity is known, it is not necessary to repeat the determination of conformity, and the processing therefore ends during step 290.

If conformity is not known, the determination of the conformity is begun by the initialization to "true" of the conformity of the attributes and children, during a step 220. This procedure is followed since, in the case where the attributes and children are opaque (see FIG. 9), it is considered that any content will be conforming (however, because of opacity, the data will be encoded in a conventional manner with priorities). During a step 230, it is determined whether the attributes are opaque. This information is associated with the grammar associated with the event. If the result of step 230 is negative, during a step 231 detailed with regard to FIG. 10, it is determined whether the attributes are conforming. If such is not the case, the conformity of the attributes is changed to "false", during a step 232, and then the opacity of the attributes is updated, during a step 235, detailed with regard to FIG. 15. In the case where the result of step 231 is positive, the step 235 of updating the opacity of the attributes is also passed to.

If the result of step 230 is positive, that is to say if the attributes are opaque or following step 235, during a step 240, the opacity of the children is determined, the children all being direct descendants of the element in question. It should be noted that the children are usually textual content nodes or elements, but that it may also be a question of comments or processing instructions. In a similar manner to what is done for the attributes, the first step, in the case where the children are not opaque, is to determine the conformity of the children, during a step 241. Two types of conformity exist for children: direct conformity, which concerns direct children, and general conformity, which concerns the children and their own children, and this recursively. The conformity used here is general conformity. If the general conformity is not positive, then the conformity of the children is changed to "false" during a step 242. Following step 242 or if the result of step 241 is positive, during a step 245, the opacity of the children is updated.

In a variant, it is possible not to carry out the updating of the opacity of the children. Thus it is possible for example to decide in advance to fix the opacity of the children by means of parameters at the start of the encoding and, in this case, the opacity will remain the same throughout the encoding. This variant can also apply to the case of attributes.

In a variant, the determination of conformity is carried out automatically, even in the case where the grammar is opaque, and the proportion of absences of conformity is recalculated after each determination of conformity. In this way, an opaque grammar can lose its opaque character if the proportion of absences of conformity drops again below an opacity threshold described with regard to step 750 illustrated in FIG. 15.

If the result of step 240 is negative, or following step 245, during a step 250 it is determined whether the attributes and content are conforming. If so, during a step 270, the element is considered to be conforming. Otherwise, during a step 260, the element is considered to be non-conforming. In both cases, the processing then ends during a step 290. It should be noted that, in the case where the attributes are opaque or the children are conforming, it is necessary to code the first child by indicating its priority. This is because, the attributes being opaque, they are coded with priorities, and the decoder does not have the possibility of knowing that attributes are being passed to the children if this is not indicated to it. By encoding the first child with its priority, the decoder is capable of making the transition between the attributes and the children and, once the first child is decoded, passing into the management of conforming children.

Figure 10:
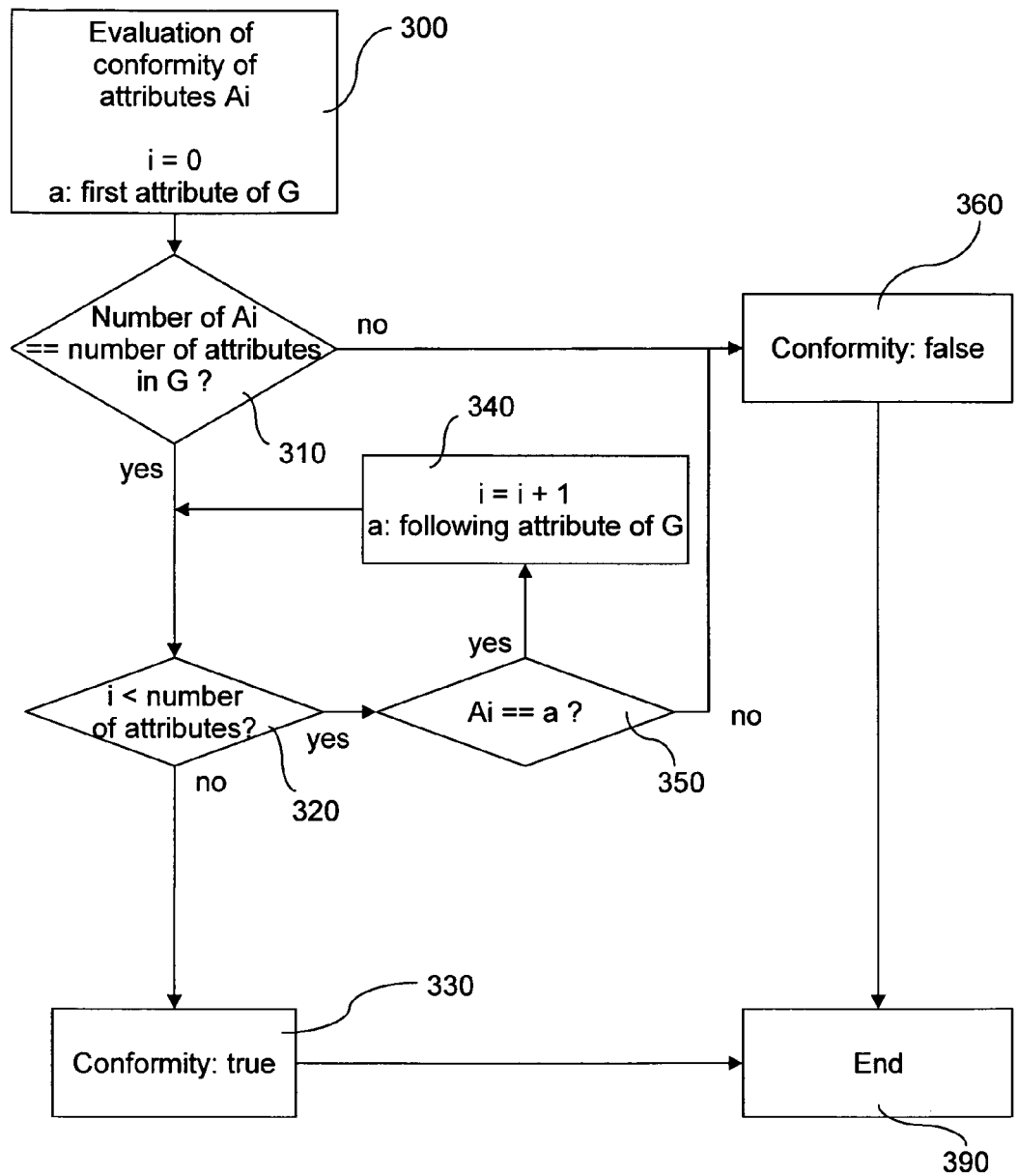
Figure 11:
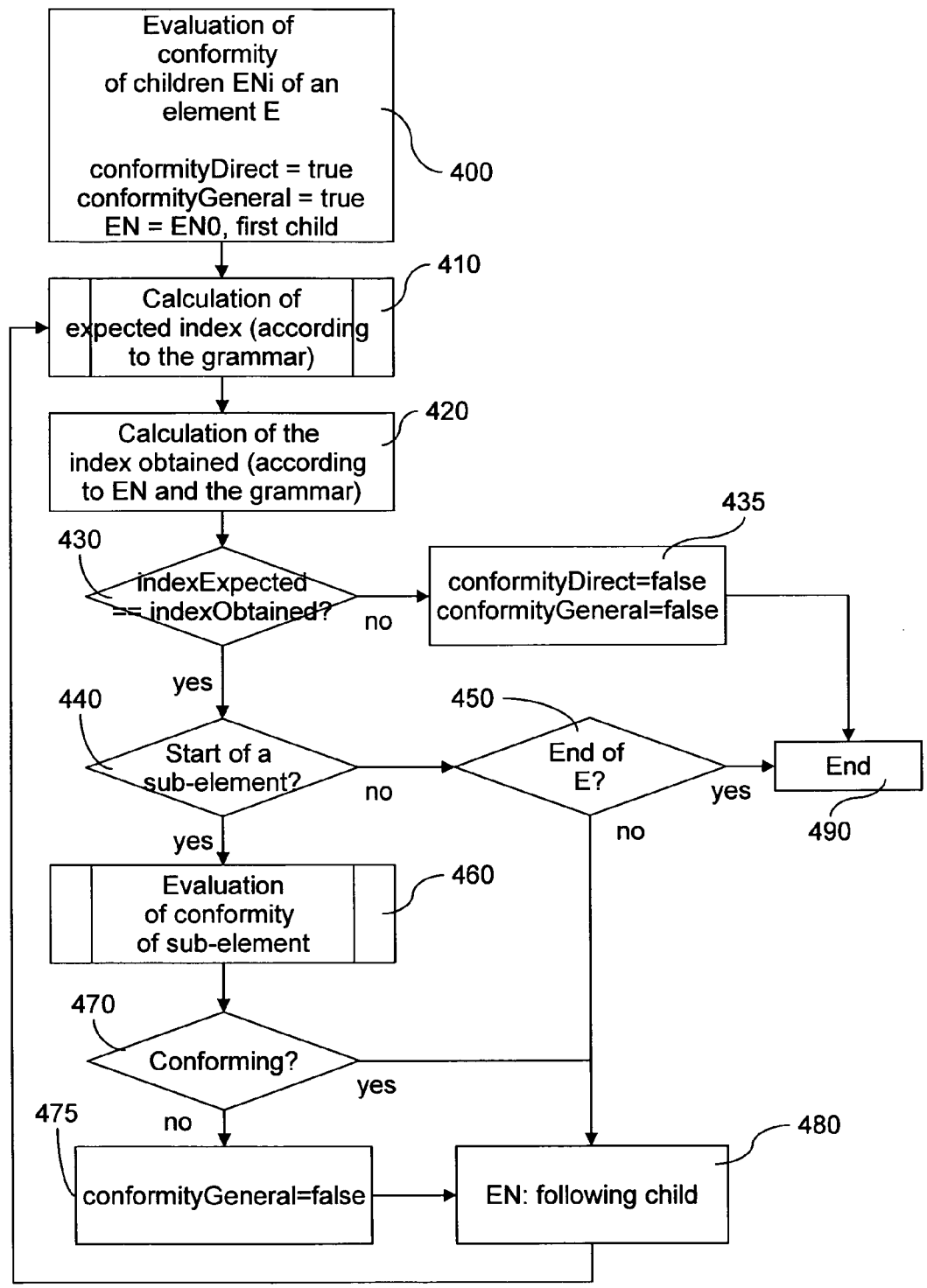

The process of comparing the XML data with the grammars (determination of conformity) requires, as detailed in FIGS. 10 and 11, navigating in parallel in the XML data and in the grammars. In order to reduce the cost of the comparison, it may be advantageous, during the first determination of conformity for a given grammar, to generate the corresponding XML events (that is to say the events obtained when the grammar is run through) and to store them in a structure associated with this grammar, for example in the form of a list of events. Thus, if the grammar does not change, it is possible to dispense with navigating in the grammars when the conformity is determined, since it suffices to compare the XML events to be encoded with the events expected according to the grammar. In the case where the grammar changes, the list of events is modified in order to reflect the modification made to the grammar. One problem that may arise, when it wished to generate the XML events from the grammars, stems from the grammars defining loops. This is the case for example with the grammar describing an element A, this element A itself containing another element A. In order to avoid saturating the memory, it is possible to fix an arbitrary limit to the number of events generated (for example linked to the size of the buffer, since it will never be possible to compare more events than there are in the buffer). Another solution, more sophisticated, consists of constructing only the XML events corresponding to the direct children of an element, and then iterating on the sub-elements if the evaluation has been successful. In this case, there necessarily arrives a moment when the evaluation fails, the grammar forming a loop but the XML data processed not forming one, and the problem is therefore resolved (in the case of an element A containing another element A, there necessarily arrives an instance of A in the XML data processed that does not contain A, otherwise the document would be infinite). Finally, since the evaluation fails certainly in the case of a loop, one of the grammars to which the loop relates will necessarily become opaque: as from this time, the problem of evaluation is no longer posed.

FIG. 10 describes the determination of the conformity of the attributes "Ai" of an XML element. During a step 300, the index "i" of the attributes of the element is initialized and there is obtained "a", the first attribute contained in the grammar G corresponding to the element in question. It should be noted that the first attribute "a" is zero if the grammar contains no element. Then, during a step 310, it is determined whether the number of attributes Ai of the element is equal to the number of attributes in the grammar. If such is not the case, the attributes Ai cannot be conforming with respect to the grammar, and the conformity is therefore changed to "false", during a step 360, before ending the processing, during a step 390.

If on the contrary the number of attributes Ai of the element is equal to the number of attributes in the grammar, during a step 320 it is determined whether the index "i" is less than the number of attributes.

If such is the case, this means that there remains at least one attribute to be processed and, during a step 350, the attribute Ai is compared with the attribute "a" obtained from the grammar. If these two attributes are not equal, that is to say if they have different names, the conformity is marked as false, during a step 360, and the processing ends at step 390. On the other hand, if the attributes are identical, the index "i" is incremented and "a" is replaced by the following attribute of G. It should be noted that, "a" being zero if all the attributes of G have already been processed, during a step 340, then step 320 is returned to so as to reiterate the comparison of attributes.

When, during step 320, it is determined that "i" is equal to the number of attributes, during a step 330, the conformity changes to "true", all the attributes having been compared successfully, and the processing ends at step 390.

It should be noted that the mechanism described here would function identically if it were sought to take into account the declaration of namespaces, or "namespaces" in English. These declarations, like the attributes, take place in the starts of elements. In practice, this type of conformity is not in all cases advantageous since many XML documents contain only a few declarations of namespaces, and this in the root element.

FIG. 11 describes the determination of the conformity of the children "ENi" of an element "E". During this processing, two types of conformity are determined: the direct conformity of the children "ENi", and the general conformity, which takes into account the descendants of the children "ENi", according to a recursive conformity analysis. Direct conformity is used for considerations of opacity, while general conformity is used for encoding the content of the element depending on whether or not it is in conformity with the grammar. Distinguishing in this way direct conformity from general conformity makes it possible to avoid, as soon as the content of a child is not conforming, the content of the parent in its turn becoming non-conforming, such as for example in the document illustrated in FIG. 4.

The processing begins at a step 400 of initializing the direct and general conformities to the value "true" and that of "EN" with the value "EN0" corresponding to the first child or the value "0" if no child exists. The index expected according to the grammar is then calculated, during a step 410 detailed with regard to FIG. 12, an index that corresponds to the index in the grammar of the production describing the next event to occur if the data is conforming. Moreover, the index actually obtained by virtue of the grammar and the current event is calculated, during a step 420. It should be noted that the grammar returns the index of the production describing a given event when the type of event and, if the event has a name, its name, is supplied to it. Then, during a step 430, the index expected and the index obtained are compared. If these indices are not equal, this means that the children are not in conformity with the grammar: direct conformity is therefore false and, consequently, general conformity is also false, which is marked during a step 435, and the processing ends during a step 490.

On the other hand, if the indices are equal, this means that the children processed up till now are conforming, and a step 440 is therefore passed to, which consists of determining whether the event is a start of an element. It should be noted that, for more clarity, "sub-element" is spoken of in order to differentiate on the one hand the element or "principal element" and on the other hand the sub-elements, elements that are children of the principal element. Step 440 therefore consists of determining whether the event is a start of a sub-element.

If the event is not a start of a sub-element, during a step 450, it is determined whether or not this is the end of a sub-element, which consists of determining firstly whether no further child to be processed remains and secondly whether the next event to occur in the grammar is the end of the principal element, these two conditions being achieved for a sub-element end. If actually at the end of the sub-element, the processing ends at step 490. Otherwise the following child is passed to, during a step 480, the following child possibly being zero if no child remains, and then the processing is resumed at step 410.

In the case where the result of step 440 is positive, that is to say if the event is a sub-element start, during a step 460, detailed in FIG. 9, the conformity of the sub-element is determined. If the conformity is not positive, the general conformity is changed to "false", during a step 475. It should be noted that direct conformity is not involved since the child "EN" was indeed the child expected according to the grammar, it is only its content that may not be in conformity. If the result of step 460 is positive or following step 475, during a step 480, the following child is obtained and step 410 is returned to.

Figure 13:
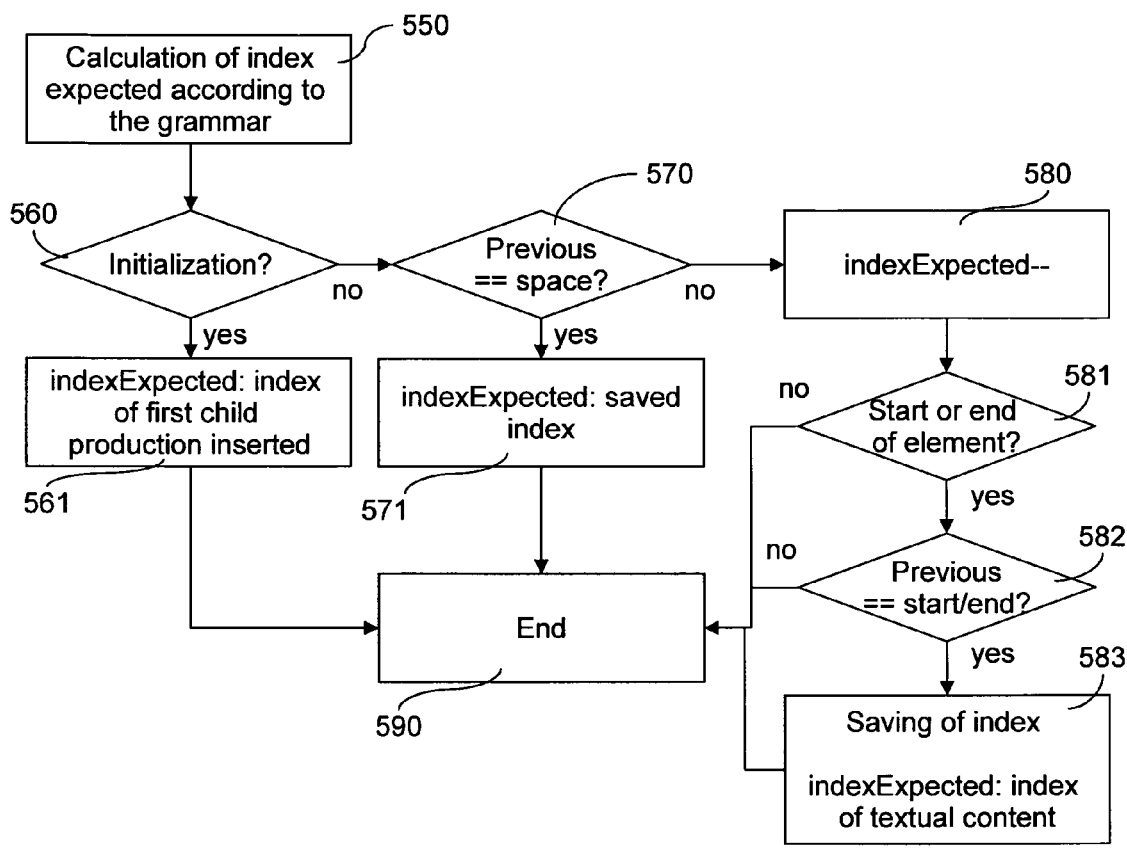

In the case where the comparison is made by taking account of the spaces, during a processing illustrated in FIG. 13, the comparison may also include a step where it is determined whether the spaces have already been encoded and therefore form part of the indexed-vocabulary tables. This is because, if such is the case, it is not necessary to encode information at each space in order to specify whether this makes reference to an indexed word, an indexed space in this case, or if its value is actually written as a character string, these characters being for example spaces or line returns. This method can easily be generalized to text nodes and to attribute values. These values having a lower probability of redundancy, it may be advantageous in this case to define the opacity concerning them as initially true; in the case where the evaluation is positive (typically in the case where the values are included in a restricted set: enumeration, Boolean, etc), the opacity will become false according to a criterion that is a function of the number of instances of the parent event and the number of possible values.

Figure 12:
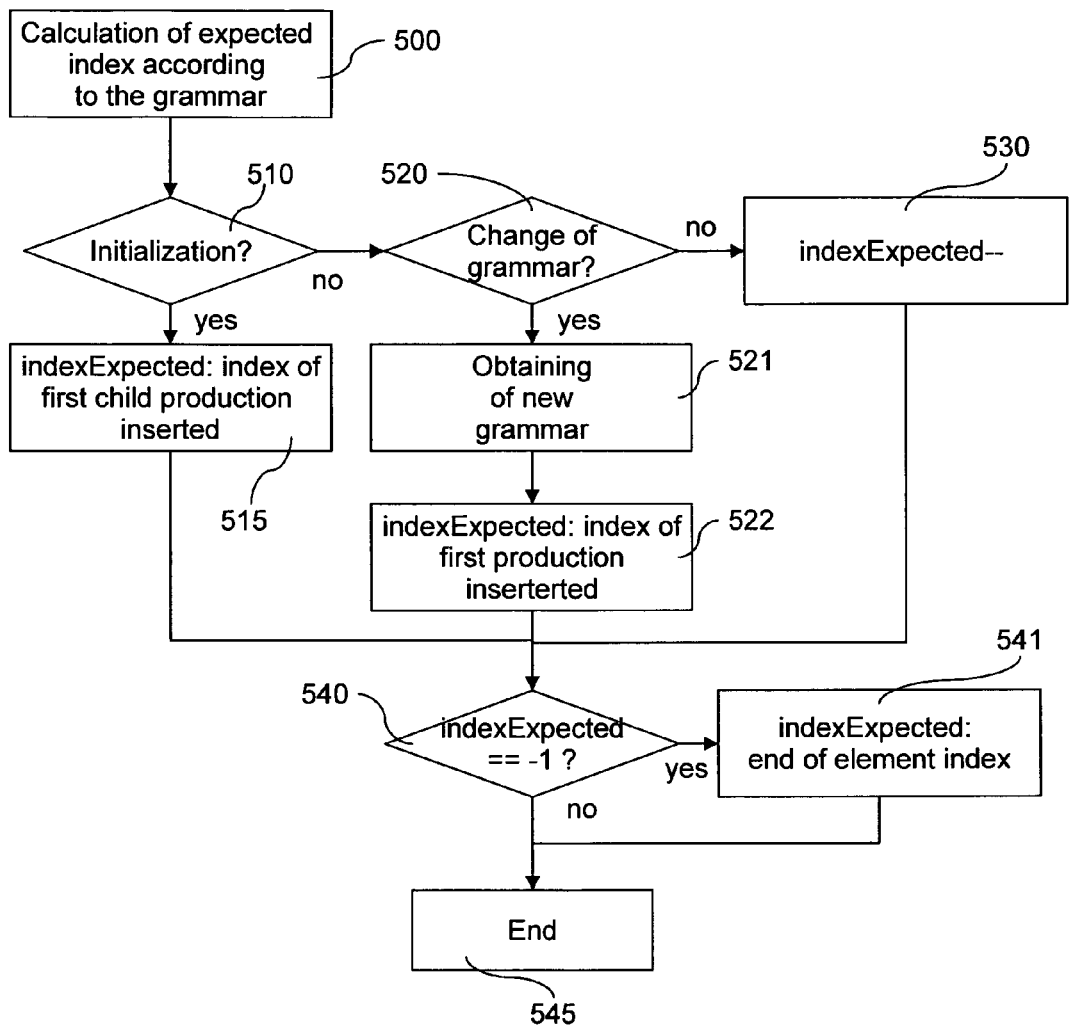

FIG. 12 describes the calculation of the index expected according to a grammar, the calculation beginning at step 500. It should be noted that the calculation of the expected index is based on navigation in the grammars, this navigation being determined by Efficient XML. In the embodiment described and depicted, this navigation involves no novelty, and is therefore not detailed: in the same way as when a document is encoded with Efficient XML, it is sometimes necessary to stack grammars, when the depth of the document increases and/or at the start of an element, or to unstack grammars, when the depth of the document decreases and/or at the end of an element. Moreover, Efficient XML separates the conceptual grammar from an element in two grammars, one corresponding to the start of the element, a grammar that contains in particular attributes, and the other containing the children of the element. However, it happens that the grammar of the element start also contains a child and it is therefore necessary, when making comparisons, to use the two grammars.

During a step 510, it is determined whether it is a case of initialization, that is to say whether it is the first time, for the element where the conformity of the children is determined, that the expected index is calculated. If such is the case, during a step 515, the first production inserted that can be a child of the element is sought in the grammar. "Inserted" means that it is not a case of a production present in the default grammar. "May be a child" means that it is not a case of an attribute or the declaration of a namespace but for example a start of an element, a textual content or a comment.

If it is not a case of an initialization, the processing continues with step 520, where it is determined whether a change of grammar is necessary, a case that presents itself when passing from the grammar describing the start of the element to the grammar describing its children. If such is the case, during a step 521, the new grammar is obtained and then, during a step 522, the expected index is calculated in the same way as during step 515, the index of the first production inserted being able to be an element child.

If the result of step 520 indicates that there is no need to change grammar, the current value of the expected index for the determination of current conformity is simply decremented, during a step 530. This is because, according to the way in which the rules are inserted in the grammar, it is known that the following event, if the data is in conformity with the grammar, will be the one corresponding to the production that immediately follows, that is to say that with the immediately lower index.

After steps 515, 522 or 530, during a step 540 it is determined whether the expected index is equal to "−1". If such is the case, this means that all the children have been processed and that therefore the next event is the end of the element. The value of the expected index is therefore modified with the index of the production describing the end of the element, during a step 541. At the end of step 541 or if the result of step 540 is negative, the processing ends during a step 545.

There is described, with regard to FIG. 13, the calculation of the expected index in the case where it is assumed that the work is on a document containing spaces, or "whitespaces" in English. Certain points of details appearing in FIG. 12 do not appear in FIG. 13 for the purpose of emphasizing the aspects specific to the taking into account of spaces. In particular, in FIG. 13, the case of changing grammar is not mentioned and the case where the index is equal to "−1" and where the index corresponding to the production describing the end of an element is chosen, this correspondence here being implicit, is not dealt with.

In order to calculate the expected index, during a step 560, it is determined whether the expected index must be initialized. If so, during a step 561, the expected index takes the value of the index corresponding to the first production inserted describing a child and the processing ends during a step 590. On the other hand, if the index is not to be initialized, during a step 570, it is determined whether the previous index calculated, which is still the current index, corresponds to a space. If so, during a step 571, the expected index is given the value of the index saved previously, that is to say the index that it would have been necessary to use for the current event but which was replaced by the index corresponding to a space. The processing then ends during step 590.

If, during step 570, it is determined that the previous index calculated does not correspond to a space, during a step 580 the value of the expected index is decremented and then, during a step 581, it is determined whether the index is that of a start or end of element. If such is the case, during a step 582, it is determined whether the index previously calculated was also that of a start or end of element. If so, this means that there are two starts of an element, two ends of elements, a start and an end of an element or an end and a start of consecutive elements, and therefore that it is necessary to insert a space between the two if it is wished for the grammar to correspond to the data. It should be noted that, in the case where an end of element follows a start of element, this insertion is not always necessary, and it may therefore be advantageous not to process this case of the standard case differently. During step 583, the expected index calculated during step 580 is saved, in order to be able to use it at the next calculation of the expected index, and then the expected index is given the value of the index of the production describing the textual content. Following step 583 or if the result of one of steps 581 and 582 is negative, the processing ends during step 590.

FIG. 14 describes the updating of a grammar G after the use of a production P. This processing is applied both during encoding and during decoding. During a step 610, it is determined whether the production priority used is of level "0", that is to say a priority written with a single figure, for example "0", "1" or "2", as opposed to a priority of level "1" written with two figures such as for example "2.0" or of level 2 with three figures such as for example "2.0.0". If the priority is of level "0", this means that P describes as well as possible the event that is encoded, and there is therefore not any need to add a more complete new production P' to the grammar. A step 690 is therefore passed to, where the processing ends.

If on the other hand the priority of the production used is not of level "0", this means that a generic rule is used, for which the priority requires more bits in order to be encoded, and it is therefore advantageous to add a new rule P' having a priority of level "0", which allows a more efficient encoding. This is because the number of bits required is lower, and, if it is a case of an event having a name, the name will be integrated in the production P', which will avoid encoding it during following occurrences.

It should be noted that inserting new productions having a priority of level "0" and possibly including a name is not peculiar to the invention: it is a case of the normal functioning of Efficient XML. On the other hand, by implementing the present invention, the position of insertion of the productions reflects the order of appearance of the XML events, while with Efficient XML the productions are simply inserted at the start of the grammars.

During a step 620, the index "i" of the last production with a priority of level "0" to have been used for encoding an event of the grammar in question is determined, this index being updated each time a priority of level "0" is used. By default, that is to say in the case where no production has been used, this index is equal to "0". The new production P', obtained conventionally, in particular by adding the name to P if the event in question has a name and, otherwise, a simple copying of P, is then inserted at the index "i" in the grammar, during a step 630. Then the priorities of the following productions are incremented (all those whose level "0" was equal to "i" or more). In this way, the uniqueness of the priorities is well preserved. It should be noted that, with Efficient XML, since the productions were inserted at position 0, all the priorities must be incremented. The processing then ends during step 690.

FIG. 15 describes the updating of the opacity for a grammar G. The way of updating the opacity does not vary according to the type of opacity in question (opacity of attributes, opacity of children). This is why opacity is spoken of generically with regard to this FIG. 15 but, in practice, the opacity of a grammar G is updated for a given criterion: updating of the opacity for the attributes, updating of the opacity for the children, each type of opacity being characterized with its own variables: number of comparisons made and number of absences of conformity encountered.

The processing is begun with the incrementation of the number of comparisons made, during a step 710. Next, during a step 720, it is determined whether the data is in conformity, that is to say whether or not the comparison has succeeded. If such is the case, then the processing ends during a step 790. On the other hand, in the case where the data is not in conformity, during a step 730, the number of absences of conformity encountered is incremented. Then, during a step 740, the number of comparisons made is compared with a predetermined number. This predetermined number corresponds to the minimum number of comparisons to be made before being able to consider a grammar as opaque in the light of the opacity threshold. This is because, if a single comparison has been made and an absence of conformity has been determined, the degree of absence of conformity is 100%. However, it is not pertinent to make the grammar opaque since few data has been processed. A minimum number of comparisons to be made below which the proportion of absences of conformity is not compared with the opacity threshold defined below it in relation to step 750 is therefore predetermined (in absolute terms, this minimum number can for example be equal to five or ten: the lower it is the greater the risk of making a grammar opaque without this being justified; the higher it is the greater the risk of failing in determinations of conformity because of an element that it would be pertinent to consider as opaque. Consequently, if it is known in advance which types of document will be encoded, it is advantageous to fix the minimum number after having carried out experiments on files of this type.

If the number of comparisons made is less than the minimum number of comparisons to be made, then the processing ends during step 790. In the contrary case, during a step 750, the proportion of absences of conformity is compared with a predetermined opacity threshold. There also, the opacity threshold is a compromise and it may therefore be advantageous to fix it after experiments if the intention is to work on a precise type of file. In absolute terms, it may be considered that, as from 10% or 20% of absences of conformity, it is pertinent to declare the grammar opaque for the criterion in question. If the proportion of absences of conformity is greater than the opacity threshold, during a step 760 the data is declared opaque. Following step 760 or if the proportion of absences of conformity is below the opacity threshold, the processing ends at step 790.

FIG. 16 describes the decoding of a document encoded according to the particular embodiment of the encoding method that is the object of the present invention described previously. During a step 800, the document is obtained. Then, during a step 810, it is determined whether data conforming to a grammar is decoded. It is known whether the data is conforming by virtue of the data previously decoded. By default, the data is not conforming. In the case where the data is not conforming, during a step 811, there is obtained the event to be followed by the decoding of a priority and, where applicable, by the decoding of the information complementary to this event, in particular its name for the start of an element. Then, during a step 812, it is determined whether the decoded event is a start of an element. If such is the case, during a step 813, it is determined whether the grammar describing the content of this element is opaque. If such is not the case, during a step 814, the bit indicating the conformity of the content of the element is indicated, a bit equal to "1" for conforming data and "0" for non-conforming data. Then a step 830 of generating the decoded event is passed to.

If, during step 813, it is determined that the grammar is opaque, step 830 is performed. This is because, the grammar being opaque, there is no conformity bit to be decoded.

If, during step 810, it is determined that the data is conforming, during a step 820, the event is obtained from the current grammar. Following step 820 or if the result of step 812 is negative, that is to say if the event is not a start of an element, during a step 821, it is determined whether the event currently being decoded has a value, which is the case with the events with a text content in particular. If so, during a step 822, the value of the event is decoded. Following step 822 or if, during step 821, it was determined that the event has no value, the step 830 of generating the event is passed to.

After step 830, during a step 840, detailed with regard to FIG. 17, the opacity data is updated. Then, during a step 850, the grammars are updated. During a step 860, it is determined whether the decoded event is the end of the document. If such is the case, the processing ends during a step 890. Otherwise the processing continues at step 810.

FIG. 17 describes the updating of the opacity data during the decoding of a document. This data concerns here the attributes and children. However, this data can, in the same way, apply to other data, for example to the namespaces that can be processed in the same way as the attributes, as disclosed above.

During a step 910, it is determined whether the current grammar is opaque for the current criterion. If such is the case, the processing ends during a step 990. If the grammar is not opaque, the expected index is compared with the index obtained, during a step 920. The expected index is the index of the production that must occur if the order of the grammar is followed, while the index obtained is the index actually obtained when the production is sought describing the decoded event in the grammar. It should be noted that, if the decoded data is conforming data, the expected index will necessarily be the same as the index obtained. However, it is necessary to update the opacity data, including in the case of success in the comparison, since the data has been encoded as conforming.

If the expected and obtained indices are different, during a step 930, it is accepted that, for the current grammar and the current parameter, typically attributes or children, the comparison has shown an absence of conformity and the processing ends during a step 990. This is because, in order to increment counters, it is necessary to wait until the end of the element has been reached. Otherwise the opacity data would not be identical to that used by the encoder when the document was encoded.

In the case where the expected index and the index obtained are identical, during a step 940, it is determined whether the decoded event corresponds to the end of the element described by the current grammar. If such is not the case, the processing ends at step 990. If it is a case of the end of the element, then the number of comparisons made for this grammar is incremented, during a step 950, and then, during a step 960, it is determined, for the attributes and for the children, whether the grammar must be declared opaque. For this purpose, the first step is to determine whether there has been an absence of conformity for the attributes. If so, during a step 961, the number of absences of conformity for the attributes is incremented. Then, during a step 962, the proportion of conformity absences is compared with the opacity threshold. The fact that the number of comparisons must be greater than a minimum number is not indicated in FIG. 17, but this is the case, in a completely similar manner to what is done during encoding. It is also crucial that the encoder and decoder share the same values for these parameters, otherwise decoding is not possible. If the proportion of absences of conformity is greater than the opacity threshold, then the grammar is considered to be opaque for the attributes, during a step 963.

If the result of one or other of steps 960 and 962 is negative, or following step 963, during a step 970, it is determined whether the comparison has shown an absence of conformity concerning the children. If so, during a step 971 the number of absences of conformity for the children is incremented. Thus, during a step 972, the proportion of absences of conformity is compared with the opacity threshold. If the proportion of absences of conformity is greater than the opacity threshold, during a step 973, the grammar is considered to be opaque for the children. If the result of one or other of steps 970 and 972 is negative or after step 973, the processing ends during step 990.

It should be noted that, although, above, only one opacity threshold value was considered, both for the attributes and for the children, in variants, different values of this threshold are used according to the proportion to which it applies.

There can be seen, in FIG. 18, a device that is the object of the present invention, or coder, 1000 and various peripherals adapted to implement the present invention. In the embodiment illustrated in FIG. 18, the device 1000 is a microcomputer of a known type connected, by means of an input card 1004, to a means of acquiring or storing hierarchized data organized in a plurality of events, for example at least one XML document.

The device 1000 comprises a communication interface 1018 connected to a network 1034 able to transmit, as an input, data to be encoded or decoded and/or, as an output, data encoded or decoded by the device. The device 1000 also comprises a storage means 1012, for example a hard disk, and a drive 1014 for a diskette 1016. The diskette 1016 and the storage means 1012 can contain data to be encoded or decoded, the encoded or decoded data and a computer program adapted to implement the method that is the object of the present invention.

According to a variant, the program enabling the device to implement the present invention is stored in read-only memory ROM (the acronym for "read-only memory", meaning non-rewritable memory) 1006. According to another variant, the program is received by means of the communication network 1034 before being stored.

This same device 1000 has a screen 1008 for displaying the data to be encoded or decoded or serving as an interface with the user in order to parameterize certain execution modes of the device 1000, by means of a keyboard 1010 and/or a mouse for example.

A central unit CPU (the acronym for "central processing unit") 1003 executes the instructions of the computer program and programs necessary for its functioning, for example an operating system. When the device 1000 is powered up, the program stored in a non-volatile memory, for example the read-only memory 1006, the hard disk 1012 or the diskette 1016, are transferred into a random access memory RAM (the acronym for "random access memory") 1008, which will then contain the executable code of the program implementing the method that is the object of the present invention as well as registers for storing the variables necessary for its use.

Naturally, the diskette 1016 can be replaced by any removable information carrier, such as a compact disk, USB key or memory card. In more general terms, an information storage means, which can be read by a computer or a microprocessor, integrated or not into the device, possibly removable, stores a program implementing the coding method that is the object of the present invention. A communication bus 1002 affords communication between the various elements included in the device 1000 or connected to it. The representation in FIG. 18 of the bus 1002 is not limiting and in particular the central unit 1003 is able to communicate instructions to any element of the device 1000 directly or by means of another element of the device 1000.

The invention claimed is:

1. A method of encoding hierarchized data organized in a plurality of events, comprising:
   obtaining a first information set of at least one event to be encoded;
   recovering a grammar based on the first information set, the grammar making it possible to describe at least the first information set;
   determining a second information set including at least structural information, from the recovered grammar;
   comparing the determined second information set to the first information set of at least one event to be encoded to determine whether at least a part, defined by a predetermined criterion, of the first information set of at least one event to be encoded can be predicted unequivocally from the grammar;
   if the result of the comparison step is positive, encoding the unequivocally predicted part of the first information set using only a general code representing conformity information that is common to all information sets; and
   encoding the information of each event to be encoded of the first information set that is not included in the determined second information set; and
   if the result of the comparison step is negative, encoding the first information set using at least priorities from the recovered grammar.

2. The method according to claim 1, wherein, during the comparison step, at least one event generated from predictions of the grammar ordered in a predefined manner is recovered and the set of information is compared with at least one event generated with the first information set of at least one event to be encoded.

3. The method according to claim 1, wherein, during the obtaining step, the first information set of at least one event to be encoded comprises structure information of at least one event to be encoded.

4. The method according to claim 1, wherein, during the obtaining step, the first information set of at least one event to be encoded comprises information indicating whether the value of the event can be encoded by reference to a previously encoded value.

5. The method according to claim 1, wherein the first information set of at least one event to be encoded is divided into a plurality of subsets of information and the result of the comparison step is positive if a predetermined selection of subsets of information of at least one event to be encoded can be predicted unequivocally from the grammar.

6. The method according to claim 5, wherein a subset is selected according to the number of times that the information subset has been able to be predicted unequivocally from the grammar and/or the number of times that the information subset has not been able to be predicted, during the coding of at least one previous event to be encoded among the plurality of events.

7. The method according to claim 5, wherein, if the result of the comparison step is positive and the first information set comprises at least one non-selected information subset, the method also comprises a step of encoding each non-selected information subset.

8. The method according to claim 5, further comprising if the result of the comparison step is negative, encoding another general code different from the general code, representing non-conformity information that is common to all information sets.

9. The method according to claim 5, wherein an information subset of the first information set comprises the information relating to the events of the text type.

10. The method according to claim 5, wherein an information subset of the first information set comprises information relating to the events of the attribute type.

11. The method according to claim 5, wherein an information subset of the first information set comprises the information relating to the events of the start of element type.

12. The method according to claim 1, wherein, during the step of recovering a grammar, the grammar is recovered according to at least one previously encoded event.

13. The method according to claim 1, further comprising updating the grammar recovered from the first information set of at least one event to be encoded.

14. The method according to claim 13, wherein, during the implementation of a step of encoding all or part of the first information set, the step of updating the recovered grammar accounts for the order of the events to be encoded.

15. The method according to claim 1, wherein a structure of the event is predicted from the recovered grammar.

16. The method according to claim 15, wherein the predicted structure is compared to the event to be encoded to determine whether or not they correspond to each other.

17. The method according to claim 16, wherein in encoding the conformity information, the predicted structure is encoded when it is determined that the predicted structure corresponds to the event to be encoded.

18. The method according to claim 16, wherein the information of each event to be encoded in the encoding step includes information of the event that is not described by the predicted structure.

19. A method of decoding hierarchized data organized in a plurality of events, comprising:
    obtaining conformity information representing that at least part of a first information set of at least one event to be decoded can be predicted unequivocally from a grammar, wherein whether the at least one event can be predicted unequivocally is determined by comparing the first information set with a second information set including at least structural information from the grammar, wherein the unequivocally predicted part of the first information set is encoded using only a general code representing the conformity information, wherein the conformity information is common to all information sets, and wherein the encoding encodes the information of each event to be encoded of the first information set that is not included in the second information set;
    obtaining the grammar; and
    generating the unequivocally predicted information from the grammar.

20. The method according to claim 19, wherein the step of obtaining the conformity information comprises decoding the conformity information.

21. The method according to claim 19, wherein, during the step of obtaining the conformity information, the conformity information is obtained according to previous decodings.

22. A device for encoding hierarchized data organized in a plurality of events, comprising:
    a means for obtaining a first information set of at least one event to be encoded;
    a means for recovering a grammar based on the first information set, the grammar making it possible to describe at least the first information set;

a determining means for determining a second information set including at least structural information, from the recovered grammar;

a comparing means for comparing the determined second information set to the first information set of at least one event to be encoded to determine whether at least a part, defined by a predetermined criterion, of the first information set of at least one event to be encoded can be predicted unequivocally from the grammar; and an encoding means for encoding, if the result of the comparison step is positive, the unequivocally predicted part of the first information set using only a general code representing conformity information that is common to all information sets, and the information of each event to be encoded of the first information set that is not included in the determined second information set, wherein if the result of the comparison step is negative, the first information set is encoded using at least priorities from the recovered grammar.

23. A device for decoding hierarchized data organized in a plurality of events, comprising:

a means for obtaining information representing that at least part of a first information set of at least one event to be decoded can be predicted unequivocally from a grammar, wherein whether the at least one event can be predicted unequivocally is determined by comparing the first information set with a second information set including at least structural information from the grammar, wherein the unequivocally predicted part of the first information set is encoded using only a general code representing conformity information that is common to all information sets, and wherein the encoding encodes the information of each event to be encoded of the first information set that is not included in the second information set;

a means for obtaining the grammar; and a means for generating the unequivocally predicted information from the grammar.

* * * * *